(12) United States Patent
Shigeta

(10) Patent No.: US 6,560,738 B1
(45) Date of Patent: May 6, 2003

(54) FAULT PROPAGATION PATH ESTIMATING METHOD, FAULT PROPAGATION PATH ESTIMATING APPARATUS AND RECORDING MEDIA

(75) Inventor: Kazuki Shigeta, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 469 days.

(21) Appl. No.: 09/605,737

(22) Filed: Jun. 29, 2000

(30) Foreign Application Priority Data

Jul. 6, 1999 (JP) ............................................ 11-191688

(51) Int. Cl.[7] .......................... G06F 11/00; H04B 17/00
(52) U.S. Cl. ....................... 714/726; 714/799; 714/724
(58) Field of Search ................................ 714/726, 725, 714/724, 799, 819, 704, 45, 3

(56) References Cited

U.S. PATENT DOCUMENTS 4,633,467 A * 12/1986 Abel et al.
6,385,665 B1 * 5/2002 Canady et al. .................. 710/2
6,301,685 B1 * 10/2002 Shigeta ....................... 714/799

FOREIGN PATENT DOCUMENTS

| JP | 1-244384 | 9/1989 |
|----|----------|--------|
| JP | 2655105  | 5/1997 |
| JP | 10-62494 | 3/1998 |
| JP | 10-154171 | 6/1998 |

\* cited by examiner

Primary Examiner—Phung M. Chung
(74) Attorney, Agent, or Firm—Young & Thompson

(57) ABSTRACT

A gate connected to an input side of a normal signal line estimated-as in a logical state equal to an expected value with an implication operation is detected as a newly implication-capable gate, and a signal line on an output side of a gate estimated as in a logical state equal to the expected value with an implication operation for the implication-capable gate is initialized to a logical state before the implication operation. A signal line in which a logical contradiction occurs in the logical state estimated with the implication operation is registered, and the number of occurrences thereof is recorded. Additionally, the result of the implication operation is stored as history information, and when the number of occurrences of logical contradictions exceeds an allowable number, the history information is traced to initialize a logical state of a signal line causing the logical contradiction to a state before the implication operation until the number falls within the allowable number.

15 Claims, 13 Drawing Sheets

(a)                  (b)

(a)

(b)

| 10 | L2, 1 |
| 9 | L1, 1 |
| 8 | L7, 3 |
| 7 | L4, 3 |
| 6 | L8, 2 |
| 5 | L12, 2 |
| 4 | L11, 2 |
| 3 | L10, 1 |
| 2 | L9, 1 |
| 1 | L6, 1 |

FAULT PROPAGATION PATH ESTIMATING METHOD, FAULT PROPAGATION PATH ESTIMATING APPARATUS AND RECORDING MEDIA

BACKGROUND OF THE INVENTION

1. Field of the Invention

The present invention relates to a fault propagation path estimating method and a fault propagation path estimating apparatus for accurately estimating a fault point in a combinational logic circuit, and a recording medium therefor.

2. Description of the Related Art

A fault propagation path estimating apparatus, which extracts a path through which a faulty state may propagate in a combinational logic circuit, can be used as part of a fault diagnostic system for a sequential circuit as described in JP-A-08-146093 or JP-A-10-062494. A fault may exist inside a combinational logic circuit or a faulty state may be included in an input signal pattern.

Conventional methods of estimating a fault propagation path include an inverse logical expansion method which applies a back track method disclosed in JP-A-10-154171. This is a method of extracting a fault propagation path by comparing the estimated logical state of an input signal derived with the inverse logical expansion method and the logical state inside a combinational logic circuit derived in the process with a logical state (hereinafter referred to as "expected value") of each node derived from a previous logical simulation of a normal circuit.

In such a method, however, when the logical states of respective signal lines (lines for connecting gates which serve as components of the circuit) are estimated, the existence of multipliers or the like in the combinational logic circuit causes a significant number of decisions for the logical states of the signal lines, leading to a long time expected for calculation. To avoid this, a method is contemplated which provides faster estimation of a fault propagation path by limiting decision processing only to the signal lines relating to the fault propagation path. A conventional fault propagation path estimating apparatus for performing such processing is hereinafter described with reference to FIG. 1 and FIG. 2.

FIG. 1 is a block diagram showing a configuration of the conventional fault propagation path estimating apparatus, and FIG. 2 is a block diagram showing a configuration of an implication operation unit. It should be noted that the fault propagation path estimating apparatus shown in FIG. 1 logically estimates a fault propagation path by repeating decisions and implication operations from a signal line in a known logical state in a combinational logic circuit, and does not estimate a fault propagation path by actually inputting a signal to the combinational logic circuit.

In FIG. 1, the conventional fault propagation path estimating apparatus comprises input device 11 such as a keyboard, data processing unit 12 for estimating a fault propagation path in a combinational logic circuit, storage device 14 including a hard disk or memory for storing information, and output device 15 such as a display or printer.

Storage device 14 comprises logic circuit configuration storing section 141 for storing the configuration of the combinational logic circuit for which a fault propagation path is to be estimated, such as types of gates which serve as components of the circuit, connections between the gates, connections between the gates and signal lines, connections between the signal lines and the like; decision state storing section 143 for storing decision levels at the estimation of the logical states of the respective signal lines with implication operations, later described; and logical state storing section 144 for storing the logical states of the respective signal lines during estimation and the expected values of the respective signal lines, respectively. The decision level represents the accumulated number of decisions (for the entire circuit) at the point of the decision of a logical state for a signal line.

Data processing unit 12 comprises initial setting section 121 for setting the logical states of input/output terminals in the combinational logic circuit in specified states at the estimation of a fault propagation path; implication operation section 123 for estimating a logical state for each signal line in the combinational logic circuit; logical contradiction determining section 124 for determining whether or not a contradiction occurs in the logical states of the signal lines estimated by implication operation section 123; processing end determining section 125 for determining whether or not the logical states of all the signal lines have been estimated in the combinational logic circuit; X (Don't Care) state setting section 122 for setting the initial logical state of a signal line in an unestimated logical state in an X (Don't Care) state and recording this in logical state storing section 144; back track section 126 for erasing the decided logical state of a signal line for which the logical state has already been estimated and returning the logical states of the respective signal lines to the logical states before the decisions; logical value comparing section 130 for comparing the logical states of the respective signal lines estimated in the implication operations with the expected values of the respective signal lines to extract a fault propagation path; fault output terminal connected and related line extracting section 131 for extracting any fault propagation path of the fault propagation paths extracted by logical value comparing section 130 that has a fault thereon directly affecting an output terminal and outputting associated data to output device 15; U (Unknown) state search section 127 for checking the logical states of the inputs and outputs of the respective gates which serve as components of the combinational logic circuit to detect any signal line in a logical state Unknown (undefined); fault propagation path affecting line search section 128 for detecting any signal line relating to any fault propagation path from the signal lines in the Unknown state; and logical value decision section 129 for deciding the logical state of a signal line in the logical state Unknown connected through a gate to the signal line on the fault propagation path detected by fault propagation path affecting line search section 128. The signal line on the fault propagation path refers to a signal line in which the estimated logical state is different from the expected value.

As shown in FIG. 2, implication operation section 123 comprises implication operation-capable gate search subsection 238 for detecting any gate for which the implication operation can be performed; basic implication operation subsection 241 for estimating the logical states of respective input/output signal lines of a gate connected to the input/output terminal set by initial setting section 121, of a gate connected to the signal line decided by logical value decision section 129, and of the gate detected by implication operation-capable gate search subsection 238; logical contradiction detecting subsection 240 for detecting whether or not the logical state newly estimated by basic implication operation subsection 241 contradicts previously estimated the logical state; and implication operation end determining subsection 239 for determining that all the implication operations are completed when no implication operation-capable gate is detected.

The logical states of the respective signal lines are estimated by basic implication operation subsection 241 as "0," "1," "X" or "U." The newly estimated logical state of the signal line is recorded in logical state storing section 144, and the decision level at that point is recorded in decision state storing section 143. The implication operation-capable gate refers to a gate in which the logical state of an input or output signal line in an undecided logical state may be estimated from the decided logical state ("0" or "1") of an input or output signal line with the implication operation based on the function of the gate.

Next, the operation of the conventional fault propagation path estimating apparatus is described using FIG. 3 to FIG. 5 with reference to FIG. 1 and FIG. 2.

FIG. 3 is a flow chart showing a procedure of processing in the data processing unit shown in FIG. 1, and FIG. 4 is a flow chart showing a procedure of processing in the implication operation section shown in FIG. 2. FIG. 5 is a diagram showing an example of implication operation results of the conventional fault propagation path estimating apparatus in the form of a circuit diagram showing estimation results of logical states of inputs and an output in a two-input NAND gate.

The logical states of the respective signal lines estimated by the conventional fault propagation path estimating apparatus shown in FIG. 1 are "0," "1," "U (Unknown)," and "X (Don't Care)." "U (Unknown)" represents an undefined state in which the logical state of a signal line cannot be determined either "0" or "1," while "x (Don't Care)" represents a case where either logical state "0" or "1" of a signal line cause no contradiction in the logical state of the entire combinational logic circuit, in other words, either logical state is permitted.

The conventional fault propagation path estimating apparatus shown in FIG. 1 performs, using a signal line in a known logical state as a base point, an implication operation for each gate connected to the signal line to estimate a logical state of a signal line located across the gate. Similar processing is then repeated based on the estimated logical state to estimate the respective logical states of the signal lines in the combinational logic circuit. For a signal line in the logical state "U (Unknown)" connected through a gate to a signal line on a fault propagation path, its logical state is decided as "0" and "1," and based on the decided logical state, an implication operation similar to the aforementioned operation is repeated to extract a fault propagation path. In the case of a fault present in the combinational logic circuit, since the implication operations repeated with decisions result in a logical contradiction generated in the fault propagation path, the fault propagation path estimating apparatus shown in FIG. 1 terminates the implication processing at the point of the detection of such a logical contradiction.

In FIG. 3, data processing unit 12 first uses initial setting section 12 to set the logical states of the input/output terminals of the combinational logic circuit for which a fault path is to be estimated in specified states through input device 11 (step C1) to initialize a decision level (dlevel=0) (step C2). Data processing unit 12 sets the logical states of signal lines in undecided logical states to "X" or the initial state of the implication operation, and records the processing result in logical state storing section 144 (step C3).

Next, data processing unit 12 performs the implication operation using implication operation section 123 (step C4).

The implication operation refers to processing for estimating an unestimated logical state of an input or output signal line from the estimated logical state of an input or output signal line of a gate. The procedure of the implication operation is described using FIG. 4.

In FIG. 4, implication operation section 123 first searches an implication operation-capable gate using implication operation-capable gate search subsection 238 (step D1).

Subsequently, implication operation end determining subsection 239 is used to determine whether or not all the implication operations are completed (step D2). At step D2, implication operation end determining subsection 239 determines that all the implication operations are not completed if any implication operation-capable gate is detected, or determines that all the implication operations are completed if no implication operation-capable gate is detected.

If all the implication operations are determined as complete at step D2, the processing is moved to step C5 shown in FIG. 3. Alternatively, if all the implication operations are determined as incomplete, implication operation section 123 performs the implication operation for the gate detected at step D1 using basic implication operation subsection 241 to estimate the logical states of the input/output signal lines.

Basic implication operation subsection 241 estimates the logical state of the input/output signal lines for which the initial setting has been performed at step C1 in FIG. 3, and the logical state of each input/output signal line of a gate connected to the signal line for which the logical state has been decided by logical value decision section 129 and of the implication operation-capable gate detected by implication operation-capable gate search subsection 238. The estimated logical states are recorded in logical state storing section 144, while the decision level at that point is recorded in decision state storing section 143.

As an example of the implication operation in the conventional fault propagation path estimating apparatus, FIG. 5 shows results of implication operations for a two-input NAND gate. FIG. 5(a) shows estimation results of the logical state of an output signal line when the logical states of input signal lines of the two-input NAND gate are determined, while FIG. 5(b) shows estimation results of the logical states of the input signal lines when the logical state of the output signal line of the two-input NAND gate is determined.

As shown in FIG. 5(a), in the case of the NAND gate, if the logical state "0" is present on either of the input signal lines, the output signal line is estimated as the logical state "1." If both logical states of the input signal lines are "1," the output-signal line is estimated as the logical state "0."

As shown in FIG. 5b, if the state of the output line of the two-input NAND gate is "0", both logical states of the input signal lines are estimated as "1." If the state of the output line of the two-input NAND gate is "1" and the logical state of one of the input signal lines is "1," the logical state of the other input signal line is estimated as "0."

Upon completion of the implication operation at step D3 shown in FIG. 4, implication operation section 123 detects whether or not any contradiction occurs between the newly estimated logical states and the previously estimated logical state using logical contradiction detecting subsection 240 (step D4). If no logical contradiction is detected, the processing returns to step D1 and the processing from step D1 to D4 is repeated. Alternatively, if any logical contradiction is detected at step D4, the implication operation is terminated to move to the processing at step C5 shown in FIG. 3.

Upon completion of the implication operation at step C4, data processing unit 12 determines whether or not any logical contradiction occurs in the respective signal lines from the implication operation using logical contradiction determining section 124 (step C5). If any logical contradiction is present, the processing moves to step C12, later described. Alternatively, if no logical contradiction is present, processing end determining section 125 is used to determine whether or not the logical states of all the signal lines have been estimated (step C6).

If data processing unit 12 determines that the logical states of all the signal lines have not been estimated, it checks the input/output logical states of the respective gates in the combinational logic circuit using U (Unknown) state search section 127 to search any signal line in an undefined logical state or Unknown (step C7), and detects any signal line relating to a fault propagation path from the signal lines in the Unknown state using fault propagation path affecting line search section 128 (step C8).

Next, logical value decision section 129 is used to decide the logical state as "0" of the signal line detected by fault propagation path affecting line search section 128, and increments the decision level by one (dlevel +1) (step C9). Then, the processing returns to step C4 to perform the implication operation for that signal line using implication operation section 123.

On the other hand, if data processing unit 12 determines that the logical states of all the signal lines have been estimated at step C6, the logical states of the signal lines have been defined as "0," "1" or "X." Thus, logical value comparing section 130 is used to extract any signal line in a logical state different from that of the expected value, i.e. a fault propagation path (step C10).

In addition, fault output terminal connected and related line extracting section 131 is used to extract any fault propagation path which affects the output terminal (fault output terminal) of the combinational logic circuit, and the fault propagation path is outputted using output device 15 (step C11).

Next, data processing unit 12 determines, using processing end determining section 125, whether or not the signal lines after decisions (hereinafter referred to as "decided line") have been subjected to decisions for both "0" and "1" (step C12), and if all the decision processing is completed, terminates the fault propagation path extracting processing.

If all the decision processing is not completed, back track section 126 is used to extract one of the decided lines which have not been decided as "1" that has a greater decision level, and the logical state of the signal line estimated with decision processing corresponding to a greater decision level than that of the extracted decided line is initialized to "U" to return the logical states of the respective signal lines to the logical states before the decision (step C13).

Subsequently, the logical state of the decided line extracted at step C13 is decided as "1" (step C14), and the processing returns to step C4 to again perform the implication operation.

Next, specific description is made for the estimation processing for a fault propagation path with the conventional fault propagation path extracting apparatus using combinational logic circuits shown in FIG. 6 and FIG. 7 as examples.

FIG. 6 and FIG. 7 are circuit diagrams showing examples of a combinational logic circuit for which a fault propagation path is estimated. First, description is made for a case where a fault propagation path in the combinational logic circuit shown in FIG. 6 is extracted with the conventional fault propagation path extracting apparatus shown in FIG. 1. It is assumed that the combinational logic circuit shown in FIG. 6 has a fault occurring at the output signal line of gate G1 and that the logical states of input terminals L1, L2 and output terminals L7, L8 and L9 are given at the initial setting. Each symbol in brackets [ ] for each signal line represents a result of a comparison with the expected value, either in a normal state (T: True) or a fault state (F: False). In the case of the combinational logic circuit shown in FIG. 6, the fault occurring at the output of gate G1 propagates through signal lines L3, L5 and L6 to signal lines L7 and L9 connected to output terminals. It is assumed herein that only the logical states of the input terminals and output terminals can be observed, and the logical states of the signal lines other than those are not known.

In FIG. 6, when the logical states of the input terminals and output terminals are specified as L1=[T], L2=[T], L7=[F], L8=[T], and L9=[F] through input device 11, data processing unit 12 sets the logical states of the input terminals and output terminals in specified states using initial setting section 121, and sets the logical states of the signal lines other than the input/output terminals to "X" using X (Don't Care) state setting section 122 (steps C1 to C3).

Next, data processing unit 12 detects any implication operation-capable gate from within the ombinational logic circuit using implication operation-capable gate search subsection 238 in implication operation section 123 (step D1). In this example, gates G5, G6, and G7 are detected, and implication operation processing is continued in response to the determination that the implication operation is not completed (step D2).

Data processing unit 12 then performs implication operations using basic implication operation subsection 241 in implication operation section 123, and estimates L5=[F] with the implication operation for gate G5, L6=[F] with the implication operation for gate G6, and L4=[T] with the implication operation for gate G7 (step D3).

Next, data processing unit 12 determines whether any logical contradiction exists in the logical states estimated by basic implication operation subsection 241 using logical contradiction detecting subsection 240 in implication operation section 230 (step D4). Specifically, the logical states of the input/output signal lines of the respective gates are estimated as "0" or "1" using a true table, and the result is compared with the expected value to determine [T] or [F].

Since no logical contradiction occurs in this example, implication operation section 123 returns to step D1 and again searches any implication operation-capable gate and detects gates G2, G3, and G4 (step D1).

Next, implication operation section 123 in data processing unit 12 performs implication operations for the respective gates detected at step D1 using basic implication operation subsection 241, and estimates L2=[T] with the implication operation for gate G2, L3=[F] with the implication operation for gate G3, and L3=[F] with the implication operation for gate G4 (step D3).

Then, implication operation section 123 uses logical contradiction detecting subsection 240 to determine whether any logical contradiction occurs in the logical states estimated by basic implication operation subsection 241. Again, no logical contradiction occurs to the previously estimated logical states (step D4). Therefore, implication operation section 123 returns to step D1 and again searches any implication operation-capable gate and detects gate G1.

Next, data processing unit 12 estimates L1=[F] with the implication operation for gate G1 (step D3). However, since input terminal L1 has been specified as L1=[T] at the initial setting, a logical contradiction is detected to terminate the implication operation (step D4).

With the aforementioned processing, the logical states of all the signal lines are estimated respectively, and signal lines L3, L5, L6, L7, and L9 are obtained as a fault propagation path.

Next, description is made for a case where a fault propagation path is estimated with the conventional fault propagation path estimating apparatus in a combinational logic circuit with a loop present as shown in FIG. 7.

When a fault propagation path in the combinational logic circuit shown in FIG. 7 is extracted, the procedure until the initial setting of the logical states of the input/output terminals to L1=[T], L2=[T], L7=[F], L8=[T], and L9=[F] are similar to that in the combinational logic circuit shown in FIG. 6 (steps C1 to C3).

Next, data processing unit 12 searches any implication operation-capable gate using implication operation-capable gate search subsection 238 in implication operation section 123 (step D1). Gates G1, G5, G6, and G7 are detected in this example, and implication operation processing is continued in response to the determination that the implication operation is not completed (step D2).

Subsequently, data processing unit 12 performs implication operations for the respective gates detected at step D1 using basic implication operation subsection 241 in implication operation section 123, and estimates L5=[F] with the implication operation for gate G5, L6=[F] with the implication operation for gate G6, and L4=[T] with the implication operation for gate G7. Since output terminal L8 is connected to the input of gate G1 in the combinational logic circuit shown in FIG. 7, L3=[T] is estimated with the implication operation for gate G1 (step D3).

Next, data processing unit 12 determines whether any logical contradiction exists in the logical states estimated by basic implication operation subsection 241 using logical contradiction detecting subsection 240 in implication operation section 123 (step D4). Since no logical contradiction occurs in this example, the processing returns to step D1 and any implication operation-capable gate is again searched and gates G2, G3, and G4 are detected (step D1).

Subsequently, data processing unit 12 performs implication operations for the respective gates detected at step D1 using basic implication operation subsection 241 in implication operation section 123, and estimates L2=[T] with the implication operation for gate G2, L3=[F] with the implication operation for gate G3, and L3=[F] with the implication operation for gate G4. At this point, since the logical state of signal line L3 has been estimated as L3=[T], a logical contradiction is detected at step D4 to terminate the implication operation processing.

With the aforementioned processing, the logical states of all the signal lines are estimated, and signal lines L5, L6, L7, and L9 can be obtained as a fault propagation path. However, since signal line L3 which is a fault point is estimated as [T], it is not estimated as a fault propagation path and is not included in fault candidates.

As described above, the conventional fault propagation path estimating apparatus has a problem that, when a loop exists within the combinational logic circuit for which a fault propagation path is estimated, a signal line on which a fault occurs may not be extracted as part of the fault propagation path, thereby exhibiting low accuracy of fault point estimation.

Additionally, since the implication operation is terminated at the point of the detection of a logical contradiction, the conventional fault propagation path estimating apparatus has a problem that, although it can estimate "a fault propagation path in which a faulty state propagates from an input terminal and passes through a normal combinational logic circuit" as shown in FIG. 8(a) which generates no logical contradiction during implication operations, or "a fault propagation path which propagates from a fault existing within a combinational logic circuit" as shown in FIG. 8(b) which generates a logical contradiction during processing, it cannot estimate "a fault propagation path in which a fault exists within a combinational logic circuit and a faulty state propagates from an input terminal" as shown in FIG. 8(c) or (d). Furthermore, the conventional fault propagation path estimating apparatus has limited applications since it cannot estimate a fault propagation path in a combinational logic circuit with multiple faults which result in a plurality of logical contradictions.

In addition, the conventional fault propagation path estimating apparatus has a problem that it cannot reproduce a fault propagation path within a combinational logic circuit at an arbitrary point during processing since it stores no history of the implication operations.

As another example of the fault propagation path estimating apparatus, a fault dictionary method is known in which a fault point is estimated by comparing a fault dictionary created from a previously performed fault simulation with a test result. However, since the fault simulation requiring a long calculation time must be performed for creating the fault dictionary, and the size of the dictionary is increased as the scale of the circuit is increased, the method is usually used only for detecting a single fault.

In JP-A-1-244384, described is an apparatus for determining a fault point by tracing a fault propagation path from an output terminal while the logical states of wires are respectively measured with physical analysis means such as an EB tester. However, since recent LSIs have increasingly finer chips and more highly layered wires, it is difficult to measure the logical state within the circuit with such physical analysis means.

In addition, there exists a method in which a predetermined test pattern is inputted to a combinational logic circuit to estimate a fault path based on the output result therefrom. However, since the method assumes that a fault occurs inside the combinational logic circuit and needs to create a test pattern which allows the detection of the fault at the output terminal, the creation of the test pattern requires an extremely long calculation time. Also, with such a method, it is difficult to extract only a fault propagation path relating to an output terminal (fault terminal) with its logical state recognized as being affected by the fault, and an output data amount is significantly increased if an attempt is made to determine the fault propagation path.

SUMMARY OF THE INVENTION

The present invention is made for solving the problems exhibited by the prior art as described above, and it is an object thereof to provide a fault propagation path estimating apparatus capable of accurately estimating a fault point even when a loop exists in a combinational logic circuit.

Also, it is another object of the present invention to provide a fault propagation path estimating method and a fault propagation path estimating apparatus capable of estimating a fault propagation path even when a fault exists inside a combinational logic circuit and a faulty state propagates from an input terminal, and capable of reproducing a fault propagation path during an implication operation.

To achieve the aforementioned objects, the fault propagation path estimating method according to the present invention is a method of estimating a fault propagation path for extracting a fault propagation path in a combinational logic circuit by repeating decisions and implication operations for a logical state to estimate a logical state inside the combinational logic circuit and comparing the estimated logical state with an expected value which indicates a logical state in a normal operation of the combinational logic circuit, the method comprising the steps of: detecting with the implication operation, as a newly implication-capable gate, a gate connected to an input side of a normal signal line estimated as in a logical state equal to the expected value and a gate connected to input and output sides of a signal line in a fault state estimated as in a logical state different from the expected value; and initializing a signal line on an output side of a gate estimated as in a logical state equal to the expected value with an implication operation for the implication-capable gate to a logical state before the implication operation.

Additionally, the present invention provides a method of estimating a fault propagation path for extracting a fault propagation path in a combinational logic circuit by repeating decisions and implication operations for a logical state to estimate a logical state inside the combinational logic circuit and comparing the estimated logical state with an expected value which indicates a logical state in a normal operation of the combinational logic circuit, the method comprising the step of: when a logical contradiction occurs between a logical state newly estimated with the implication operation and a logical state previously estimated, registering a signal line in which the logical contradiction occurs and recording the number of occurrences of the logical contradiction.

The result of the implication operation may be stored as history information, and when the number of occurrences of the logical contradiction exceeds a preset allowable number, the history information may be traced to initialize a logical state of a signal line causing a logical contradiction exceeding the allowable number to a state before an implication operation until the number of occurrences falls within the allowable number. The history information may be stored in a tree structure or in a stack structure.

On the other hand, the fault propagation path estimating apparatus according to the present invention is a fault propagation path estimating apparatus for extracting a fault propagation path in a combinational logic circuit by repeating decisions and implication operations for a logical state to estimate a logical state inside the combinational logic circuit and comparing the estimated logical state with an expected value which indicates a logical state in a normal operation of the combinational logic circuit, the apparatus comprising: an implication-capable normal signal line search subsection for detecting, as a newly implication-capable gate, a gate connected to an input side of a normal signal line estimated as in a logical state equal to the expected value with the implication operation; an implication-capable fault signal line search subsection for detecting, as a newly implication-capable gate, a gate connected to input and output sides of a signal line in a fault state estimated as in a logical state different from the expected value with the implication operation; and a normal output line logical state initializing subsection for initializing a signal line on an output side of a gate estimated as in a logical state equal to the expected value with an implication operation for the implication-capable gate to a logical state before the implication operation.

Additionally, the present invention provides a fault propagation estimating apparatus for extracting a fault propagation path in a combinational logic circuit by repeating decisions and implication operations for a logical state to estimate a logical state inside the combinational logic circuit and comparing the estimated logical state with an expected value which indicates a logical state in a normal operation of the combinational logic circuit, the apparatus comprising: a logical contradiction storing section for recording a signal line in which a logical contradiction occurs between a logical state newly estimated with the implication operation and a logical state previously estimated, and the number of occurrences of the logical contradiction; and a logical contradiction registering subsection for registering, when a logical contradiction occurs between a logical state newly estimated with the implication operation and a logical state previously estimated, a signal line in which the logical contradiction occurs and recording the number of occurrences of the logical contradiction in the logical contradiction storing section.

The fault propagation path estimating apparatus may further comprise a logical state storing section for storing the result of the implication operation as history information, and a contradiction signal line initializing subsection for tracing the history information when the number of occurrences of the logical contradiction exceeds a preset allowable number to initialize a logical state of a signal line causing a logical contradiction exceeding the allowable number to a state before an implication operation until the number of occurrences falls within the allowable number. The logical state storing section may store the history information in a tree structure or in a stack structure.

In the fault propagation path estimating method and fault propagation path estimating apparatus as mentioned above, a gate connected to the input side of a normal signal line in a logical state estimated as equal to its expected value with an implication operation is detected as a newly implication-capable gate, a gate connected to the output side of the normal signal line is not set as the implication-capable gate, and a signal line connected to the output side of a gate in a logical state estimated as equal to its expected value with an implication operation for the implication-capable gate is initialized to the logical state before the implication operation, thereby preventing a normal logical state from propagating to the output side during estimation.

When a logical contradiction occurs between the newly estimated logical state with the implication operation and the previously estimated logical state, the signal line with the generated logical contradiction is registered and the number of occurrences of logical contradictions is recorded. Thus, the implication operation can be continued even when the logical contradiction occurs.

Additionally, the result of the implication operation is stored as the history information. When the number of occurrences of logical contradictions exceeds the preset allowable number, the history information is traced to initialize the logical state of the signal line which causes the logical contradiction exceeding the allowable number to the state before the implication operation until the number of occurrences of logical contradictions falls within the allowable number, thereby making it possible to reproduce a fault propagation path in which the number of occurrences of logical contradictions falls within the allowable number.

DETAILED DESCRIPTION OF THE PREFERRED EMBODIMENTS

Next, the present invention is described with reference to the drawings.

First Embodiment

Figure 9:
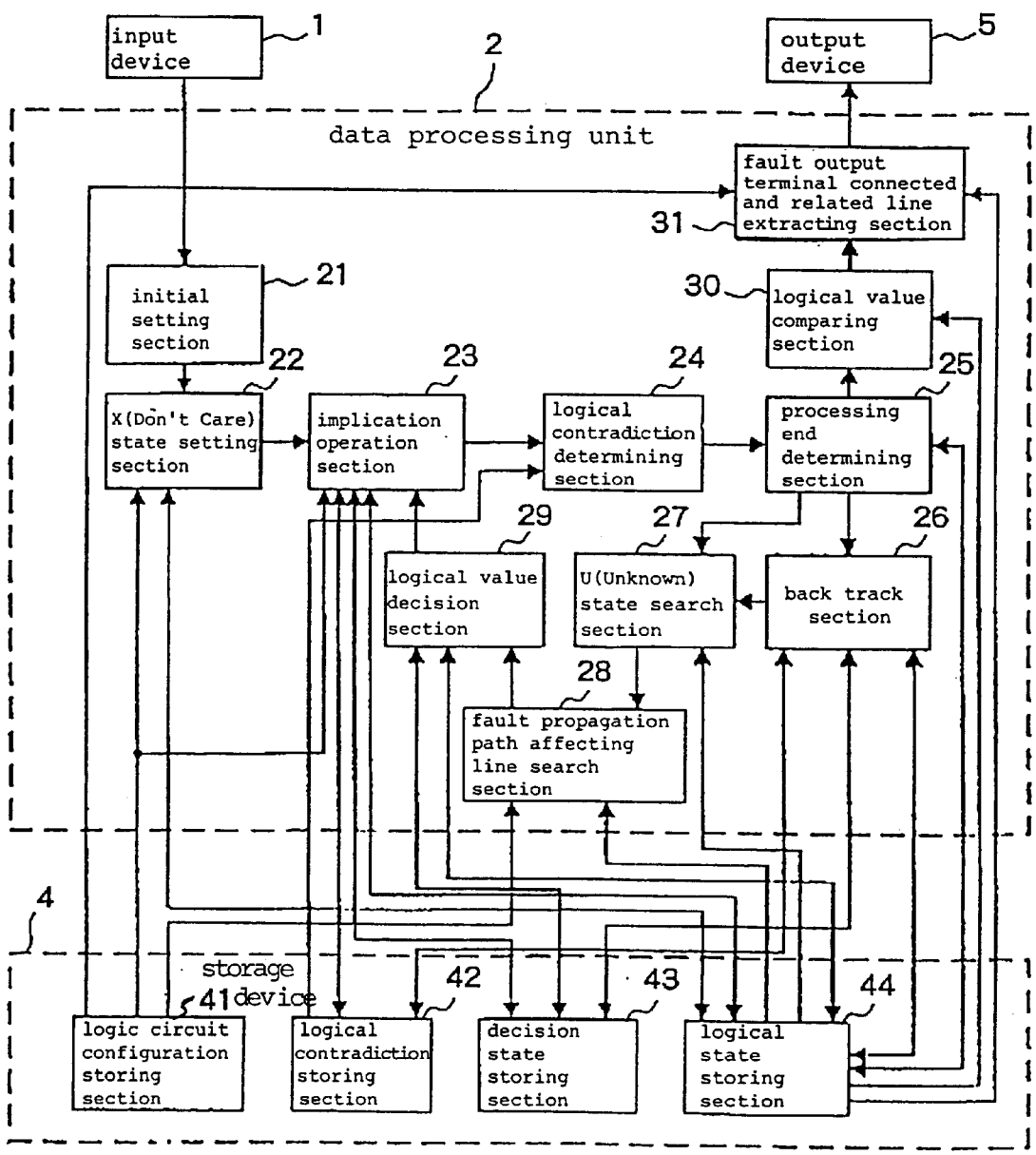
FIG. 9 is a block diagram showing a configuration of a first embodiment of a fault-propagation path estimating apparatus of the present invention.
Figure 10:
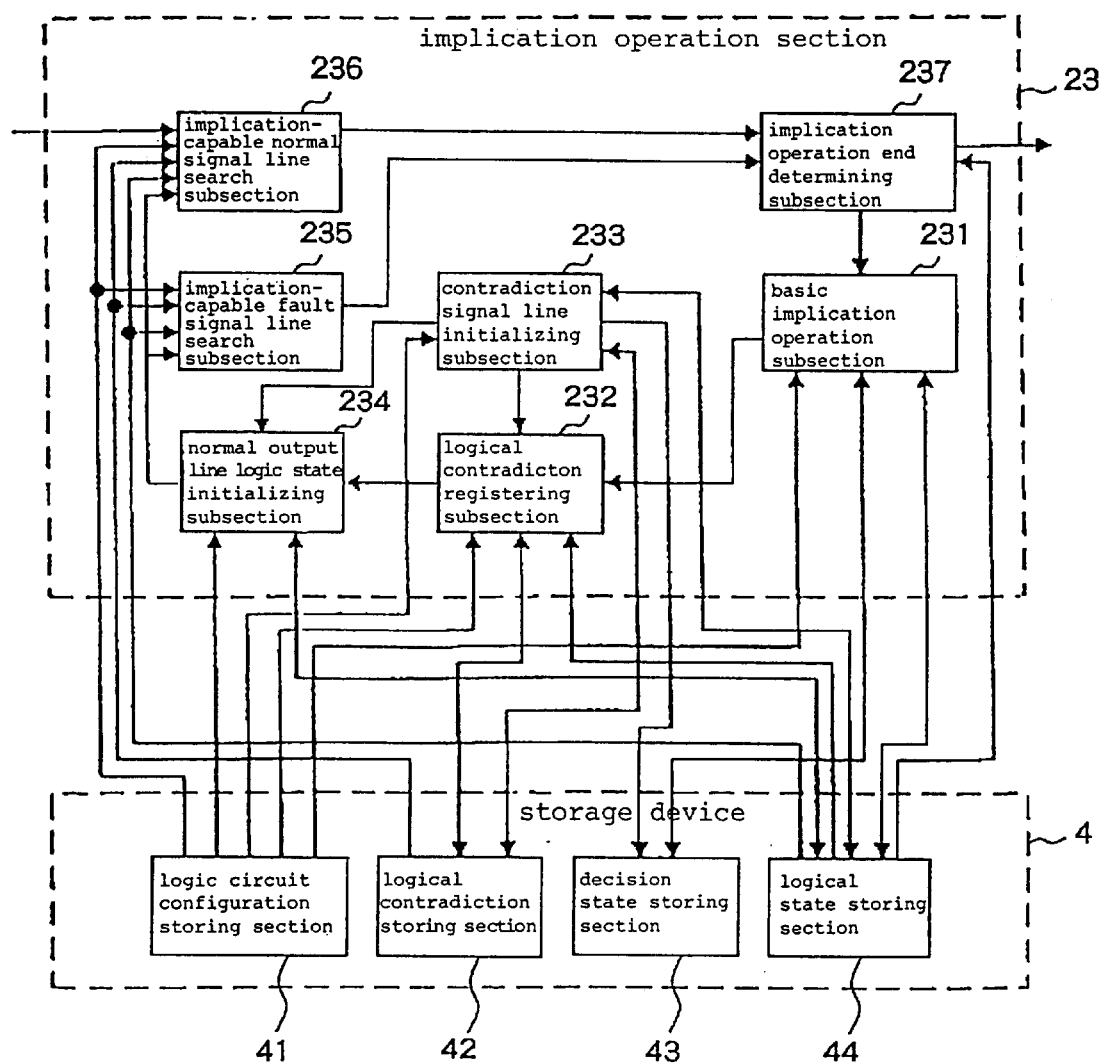
FIG. 10 is a block diagram showing an example of a configuration of an implication operation section shown in FIG. 9.

FIG. 9 is a block diagram showing a configuration of a first embodiment of a fault propagation path estimating apparatus of the present invention, and FIG. 10 is a block diagram showing an example of a configuration of an implication operation section shown in FIG. 9. It should be noted that the fault propagation path estimating apparatus shown in FIG. 9 logically estimates a fault propagation path by repeating decisions and implication operations from a signal line in a known logical state within a combinational logic circuit, and does not estimate a fault propagation path by actually inputting a signal to the combinational logic circuit.

In FIG. 9, the fault propagation path estimating apparatus of the embodiment comprises input device 1 such as a keyboard, data processing unit 2 for estimating a fault propagation path in a combinational logic circuit, storage-device 4 including a hard disk or memory for storing information, and output device 5 such as a display or printer.

Storage device 4 comprises logical circuit configuration storing section 41 for storing the configuration of the combinational logic circuit for which a fault propagation path is estimated, such as types of gates which serve as components of the circuit, connections between the gates, connections between the gates and signal lines, connections between the signal lines and the like; logical contradiction storing section 42 for storing a gate in which a logical contradiction occurs as a result of an implication operation and the number of the occurrences; decision state storing section 43 for storing decision levels of the respective signal lines at the estimation of the logical states of the respective signal lines with the implication operation; and logical state storing section 44 for storing the logical states of the respective signal lines during estimation and the expected values of the respective signal lines, respectively.

An input signal to the combinational logic circuit and an output signal'therefrom cause no logical contradiction if the combinational logic circuit operates normally. In other words, the occurrence of a logical contradiction despite no faulty state included in the input signal indicates a fault generated inside the combinational logic circuit. In the case of a single fault, a logical contradiction, if any, occurs once at most.

Data processing unit 2 comprises initial setting section 21 for setting the logical states of input/output terminals in specified states; X (Don't Care) state setting section 22 for setting the initial logical state of a signal line in an unestimated logical state in an X (Don't Care) state and recording this in logical state storing section 45; implication operation section 23 for estimating a logical state for each signal line; logical contradiction determining section 24 for detecting whether or not a contradiction occurs in the logical states of the signal lines estimated by implication operation section 23 to determine whether the number of logical contradictions exceeds a preset allowable number; processing end determining section 25 for determining whether or not the logical states of all the signal lines have been estimated; back track section 26 for erasing the decided logical state of a signal line for which the logical state has already been estimated and returning the logical states of the respective signal lines to the logical states before the decisions; logical value comparing section 30 for comparing the estimated logical states of the respective signal lines with the expected values of the respective signal lines to extract a fault propagation path; fault output terminal connected and related line extracting section 31 for extracting any fault propagation path of the fault propagation paths extracted by logical value comparing section 30 that have a fault thereon directly affecting an output terminal and outputting associated data to output device 5; U (Unknown) state search section 27 for checking the logical states of the inputs and outputs of the respective gates which serve as components of the combinational logic circuit to detect any signal line in a logical state Unknown (undefined); fault propagation path affecting line search section 28 for detecting any signal line relating to any fault propagation path from the signal lines in the Unknown state; and logical value decision section 29 for deciding the logical state of a signal line in the logical state Unknown connected through a gate to the signal line on the fault propagation path detected by fault propagation path affecting line search section 28.

Each block in data processing unit 2 shown in FIG. 9 can be readily configured with a logical circuit, and fast processing is expected by forming them into one chip. In particular, the use of a semiconductor memory for storage device 4 enables incorporation into a system LSI, and faster processing can be expected.

As shown in FIG. 10, implication operation section 23 comprises basic implication operation subsection 231 for estimating the logical states of respective input/output signal line of a gate connected to the input/output signal line set by initial setting section 21, of a gate connected to the signal line in a logical state decided by logical value decision section 29, and of a gate detected by implication-capable fault signal line search subsection 235 or by implication-capable normal signal line search subsection 236, later described; logical contradiction registering subsection 232 for detecting whether the logical states of the signal lines newly estimated by basic implication operation subsection 231 contradict the previously estimated logical states, and if a gate with a generated logical contradiction is not registered in logical contradiction storing section 42, registering the gate and recording the number of the occurrences of logical contradictions to determine whether the number of the occurrences of logical contradictions exceeds a preset allowable number; contradiction signal line initializing subsection 233 for referring to a history of implication operations stored in logical circuit configuration storing section 41, logical contradiction storing section 42, and logical state storing section 44 if the number of the occurrences of logical contradictions exceeds the allowable number to initialize the logical state of the signal line which causes the logical contradiction, and according to the result, updating the contents in logical contradiction storing section 42, decision state storing section 43, and logical state storing section 44; normal output line logical state initializing subsection 234 for initializing the logical state of an output signal line (normal output line) having a value equal to an expected value of the output signal lines of the gates in logical states estimated with the implication operations, and recording this in logical state storing section 44; implication-capable fault signal line search subsection 235 for detecting a signal line that has a value different from an expected value from the signal lines in estimated logical states and setting a gate connected to the detected signal line to be an implication operation-capable gate, except the gate with a generated logical contradiction recorded in logical contradiction storing section 42; implication-capable normal signal line search subsection 236 for detecting a signal line that has a value equal to an expected value from the signal lines in estimated logical states and setting a gate connected to the detected signal line to be an implication operation-capable gate, except the gate with a generated logical contradiction recorded in logical contradiction storing section 42; and implication operation end determining subsection 237 for determining that all the implication operations are completed and terminating the processing of implication operation section 23 when no implication operation-capable gate is detected by implication-capable normal signal line search subsection 236 or implication-capable fault signal line search subsection 235.

Next, the operation of the fault propagation path estimating apparatus of the embodiment is described with reference to FIG. 11 to FIG. 13.

Figure 11:
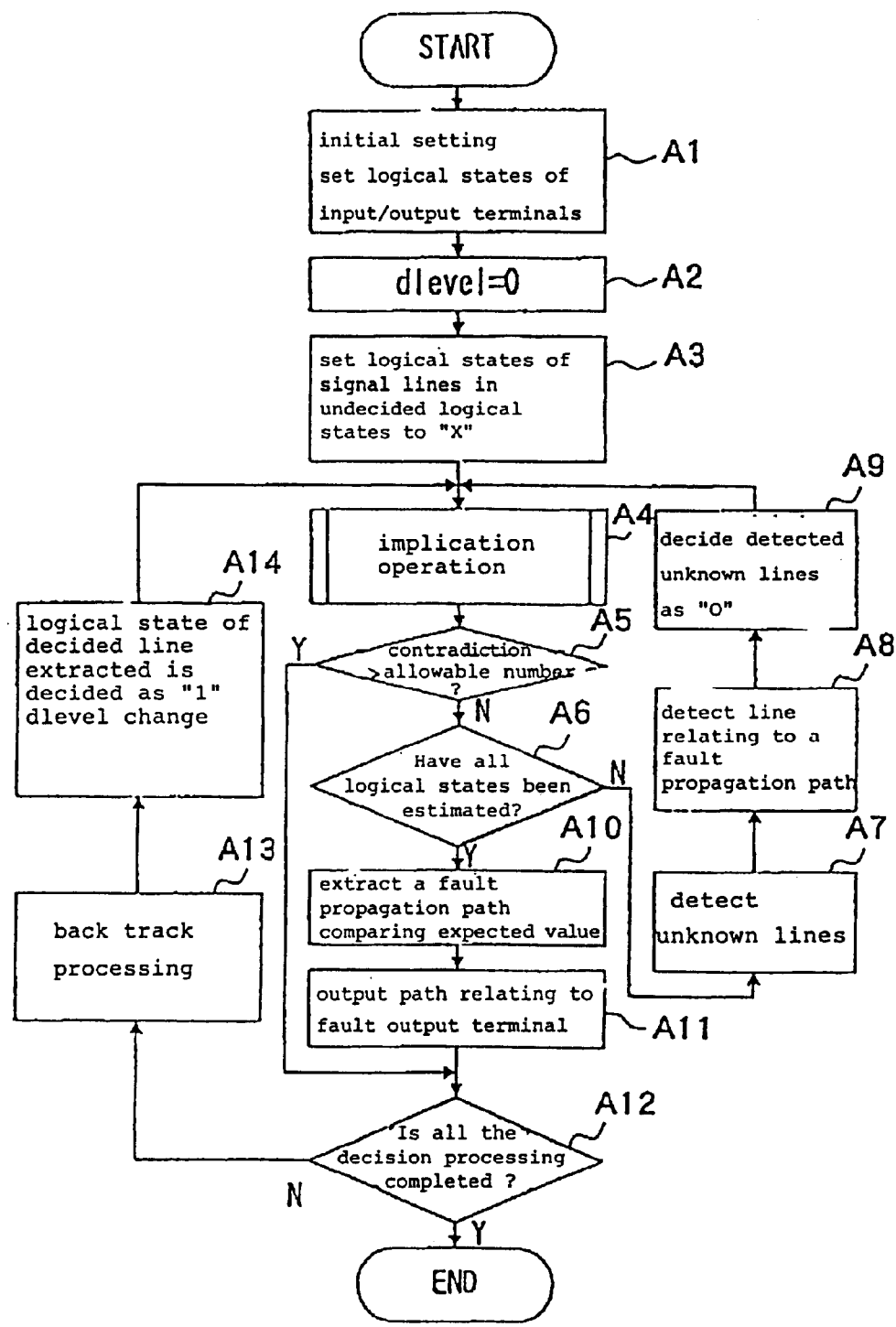
FIG. 11 is a flow chart showing a procedure of processing in a data processing unit shown in FIG. 9.
Figure 12:
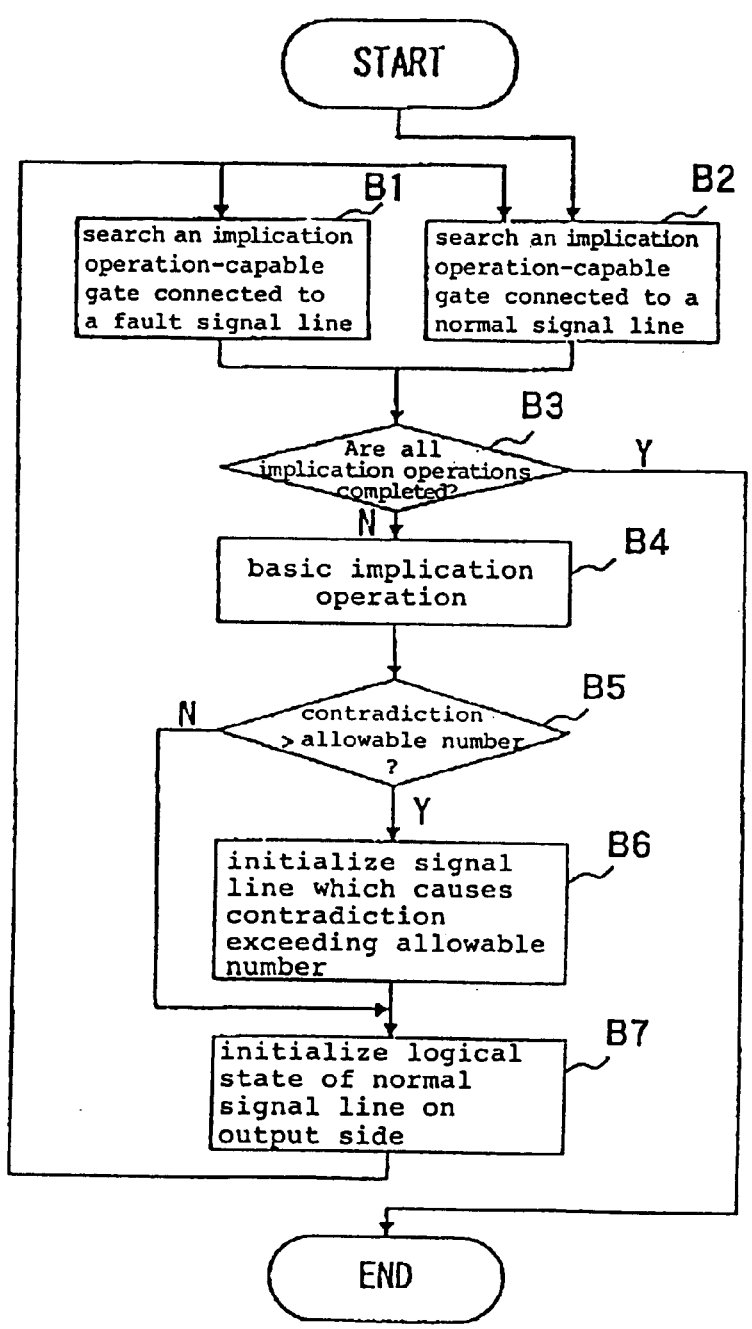
FIG. 12 is a flow chart showing a procedure of processing in the implication operation section shown in FIG. 10.

FIG. 11 is a flow chart showing a procedure of processing in the data processing unit shown in FIG. 9, and FIG. 12 is a flow chart showing a procedure of processing in the implication operation section shown in FIG. 10. FIG. 13 is a diagram showing an example of implication operation results in the fault propagation path estimating apparatus shown in FIG. 9 in the form of a circuit diagram showing estimation results of logical states of inputs and an output in a two-input NAND gate.

In the embodiment, the logical states of the respective signal lines are represented in four states, "0," "1," "U (Unknown)," and "X (Don't Care)." However, the embodiment is applicable to a case where different representations are used for indicating logical states.

Figure 1:
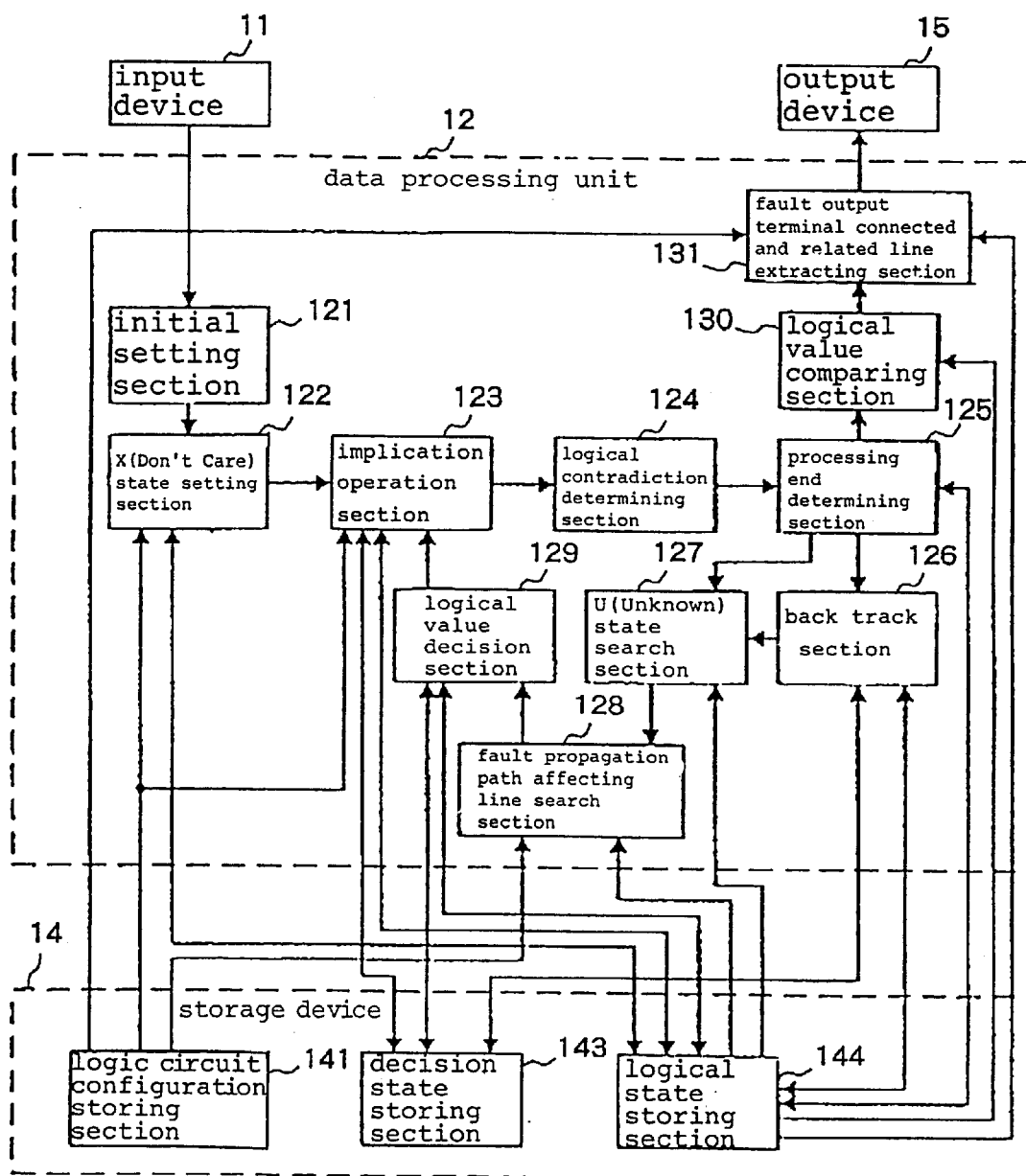
FIG. 1 is a block diagram showing a configuration of a conventional fault propagation path estimating apparatus.
Figure 2:
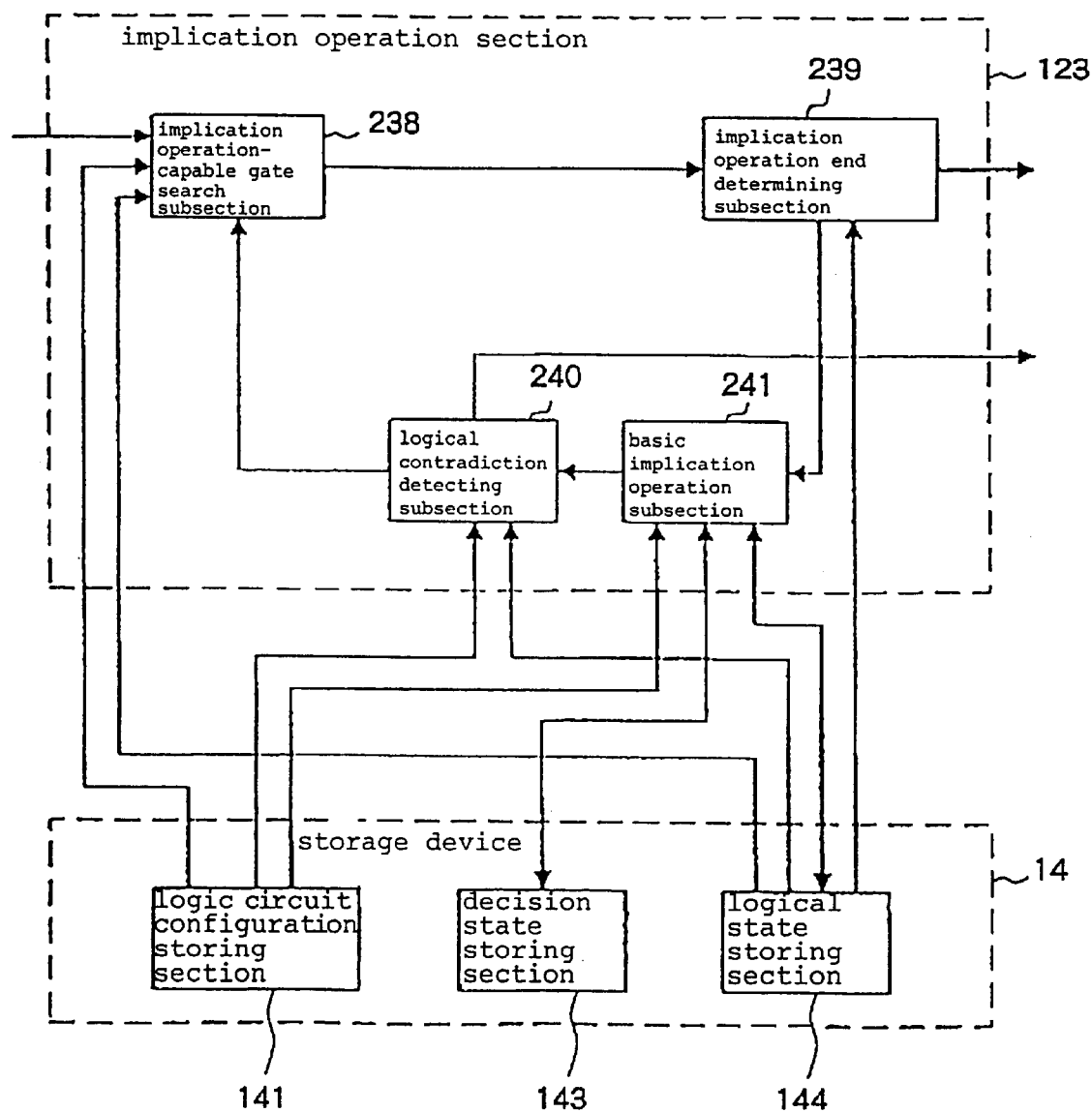
FIG. 2 is a block diagram showing a configuration of an implication operation section shown in FIG. 1.
Figure 3:
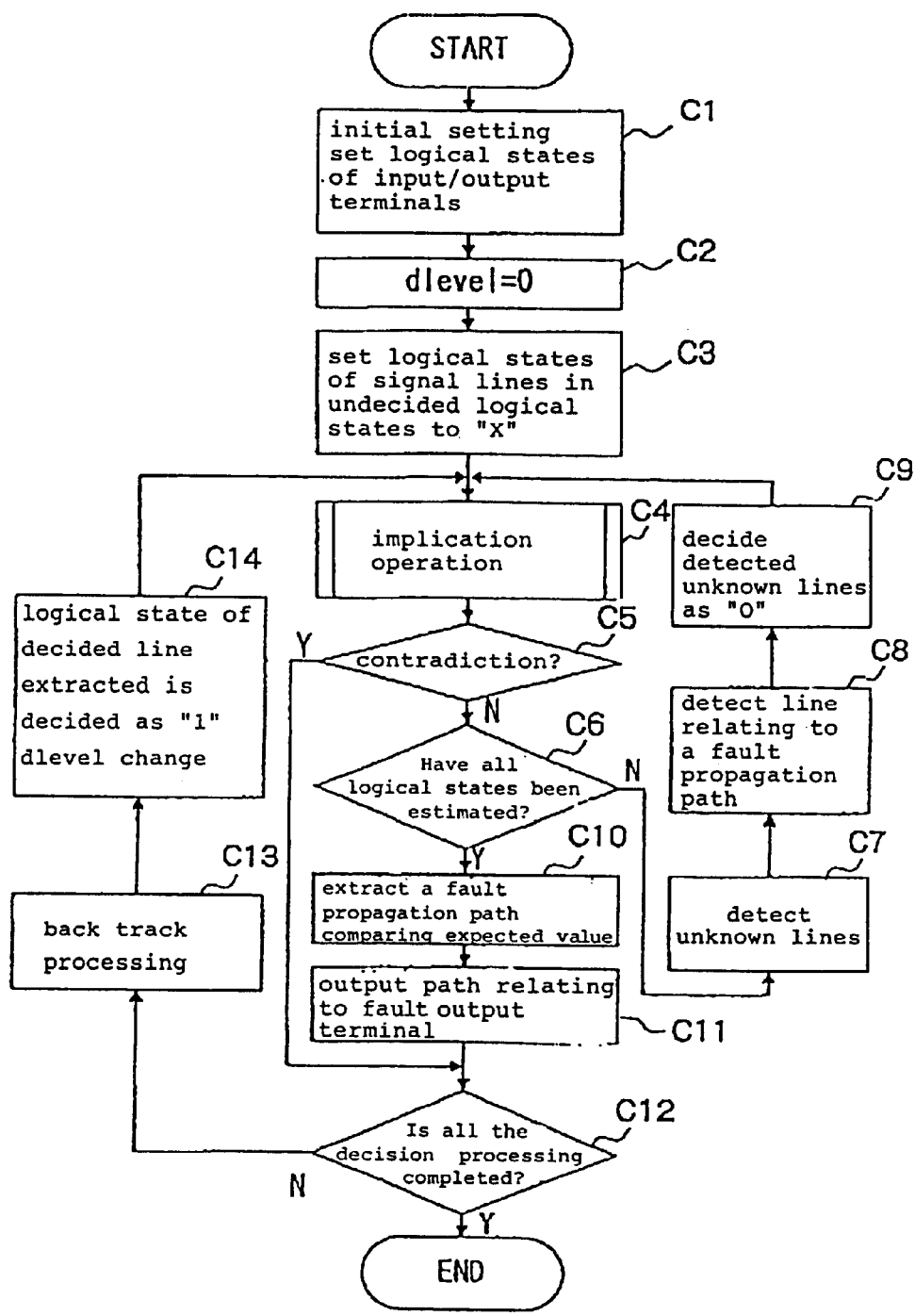
FIG. 3 is a flow chart showing a procedure of processing in a data processing unit shown in FIG. 1.
Figure 4:
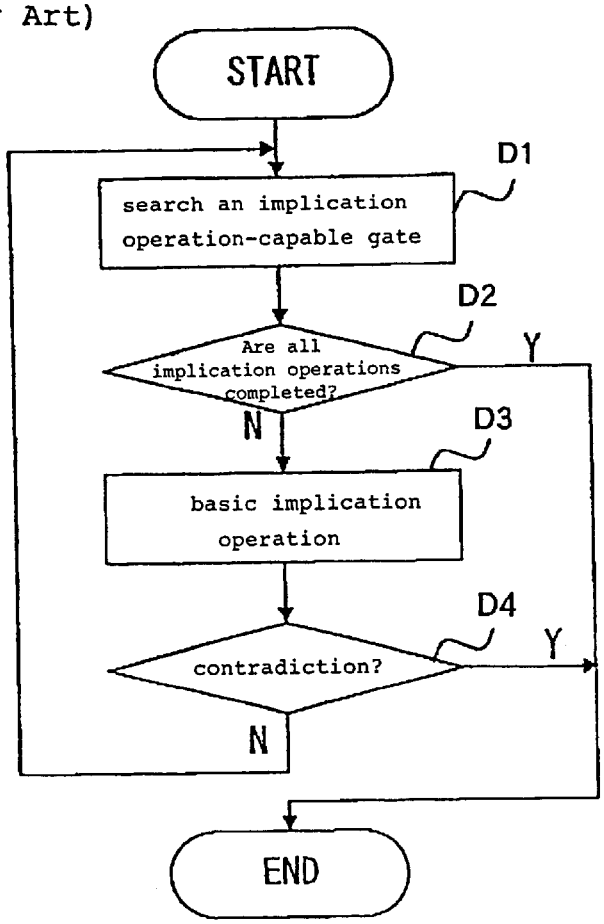
FIG. 4 is a flow chart showing a procedure of processing in the implication operation section shown in FIG. 2.

Similarly to the conventional fault propagation path estimating apparatus shown in FIG. 1, the fault propagation path estimating apparatus of the embodiment performs, using a signal line in a known logical state as a base point, an implication operation for each gate connected to the signal line to estimate a logical state of a signal line located across the gate. Similar processing is then repeated based on the estimated logical state to estimate the respective logical states of the signal lines in the combinational logic circuit. For a signal line in the logical state "U (Unknown)" connected through a gate to a signal line on a fault propagation path, its logical state is decided as "0" or "1," and based on the decided logical state, the implication operation is repeated to extract a fault propagation path. At this point, to prevent a normal logical state from propagating to the output side during estimation, a gate connected to the input side of a normal signal line estimated as a logical state equal to the expected value is detected as an implication-capable gate, while a gate connected to the output side of such a normal signal line is not set as an implication-capable gate. Additionally, a signal line on the output side of the implication-capable gate estimated as a logical state equal to the expected value with the implication operation is initialized to the logical state before the implication operation.

When a logical contradiction occurs between the logical state newly estimated with the implication operation and the previously estimated logical state, a signal line with the generated logical state is registered, and the number of the occurrences of logical contradictions is recorded. The implication operation is continued even when the logical contradiction occurs.

The result of the implication operation is stored as history information. When the number of the occurrences of logical contradictions exceeds the preset allowable number, the history information is traced to initialize the logical state of the signal line which causes the logical contradiction exceeding the allowable number to the state before the implication operation until the number of the occurrences of logical contradictions-falls within the allowable number.

In FIG. 11, data processing unit 2 of the embodiment first uses initial setting section 21 to set the logical states of the input/output terminals in the combinational logic circuit for which a fault path is estimated in specified states through input device 1 (step A1) to initialize a decision level (dlevel= 0) (step A2). Data processing unit 12 sets the logical states of signal lines in undecided logical states to "X" or the initial state of the implication operation, and records the processing result in logical state storing section 44 (step A3).

Next, data processing unit 2 performs the implication operation using implication operation section 23 (step A4).

As shown in FIG. 12, implication operation section 23 of the embodiment first detects, as an implication operation-capable gate, a gate connected to the input side of a normal signal line having a value equal to its expected value from the signal lines in estimated logical states, using implication-capable normal signal line search subsection 236 (step B2). By removing a gate connected to the output side of the normal signal at the detection of the implication operation-capable gate in this manner, a normal signal is prevented from propagating to the output side during estimation. In this example, implication operation section 23 detects a gate connected to the input/output signal line set at the initial setting (step A1) or a gate connected to the input side of the normal signal line decided by logical value decision section 28.

Next, implication operation section 23 determines whether or not all the implication operations are completed using implication operation end determining subsection 237 (step B3). If no implication operation-capable gate is detected at step B2 or step B1, later described, implication operation section 23 determines that all the implication operations are completed and terminates the implication operation to move to processing at step A5 shown in FIG. 11.

If any implication operation-capable gate is detected at step B2 or step B1, implication operation section 23 determines that the implication operation is not completed and moves to processing to step B4 shown in FIG. 12.

At step B4, implication operation section 23 estimates the logical states of the input/output signal lines of the respective implication operation-capable gate detected by step B2 using basic implication operation subsection 231. The logical states estimated by basic implication operation subsection 231 are recorded in logical state storing section 44 together with the history information of the implication operation, and the decision level at that point is recorded in decision state storing section 43. The history information of the implication operation is preferably stored in a tree structure for managing the implication history of the logical states of the signal lines, but it can be stored in a stack structure.

Subsequently, implication operation section 23 uses logical contradiction registering subsection 232 to detect any gate in which the newly estimated logical state contradicts the previously estimated logical state, and if the detected gate is not registered in logical contradiction storing section 42, registers it therein. Also, implication operation section 23 refers to logical contradiction storing section 42 to store the number of the occurrences of logical contradictions which have been detected up to that point, and determines whether the number exceeds the preset allowable number (step B5).

If the number of the occurrences of logical contradiction exceeds the allowable number at step B5, implication operation section 23, using contradiction signal line initializing subsection 233, refers to the history information of the implication operation recorded in logical state storing section 44 and the contents in logical contradiction storing section 42 to trace the history of the implication operations (step B4) performed by basic implication operation subsection 231 for initializing the logical state of the signal line which causes the logical contradiction until the number of the logical contradictions does not exceed the allowable number (step B6).

Next, implication operation section 23, using normal output line logical state initializing subsection 234, compares the estimated value stored in logical state storing section 43 with the expected value of the signal lines on the output side of the gates in the logical states estimated with the implication operation, detects any normal signal line with equal values, and returns the logical state thereof to the logical state before the implication operation at step B3 for initialization (step B7).

Implication operation section 23 then detects a gate connected to the signal line estimated as a fault propagation path as an implication operation-capable gate using implication-capable fault signal line search subsection 235 (step B1), and moves to the aforementioned processing at step B3 to determine whether all the implication operations are completed using implication operation end determining subsection 234.

Subsequently, implication operation section 23 estimates the logical sates of the input/output signal lines of the implication operation-capable gate detected at step B1 using basic implication operation subsection 231. The logical states estimated by basic implication operation subsection 231 are recorded in logical state storing section 44 together with the history information of the implication operations, and the decision level at that point is recorded in decision state storing section 43 (step B4). Thereafter, the aforementioned processing from step B5 to B7 is again performed.

In step B1 and step B2, after no implication operation-capable gate is detected at one of the steps, the processing is moved to the other. For example, while any implication operation-capable gate is detected at step B2, the gate detected at step B2 is subjected to the implication operation processing (steps B3 to B7), and after no gate is detected at step B2, the gate detected at step B1 is subjected to the implication operation processing. At the time when no gate is detected both at step B1 and step B2, the implication operation is determined as completed (step B3).

The aforementioned processing enables the implication operation only for the gates on the fault propagation path, thereby eliminating propagation of a normal logical state to the output side of the gates.

Figure 13:
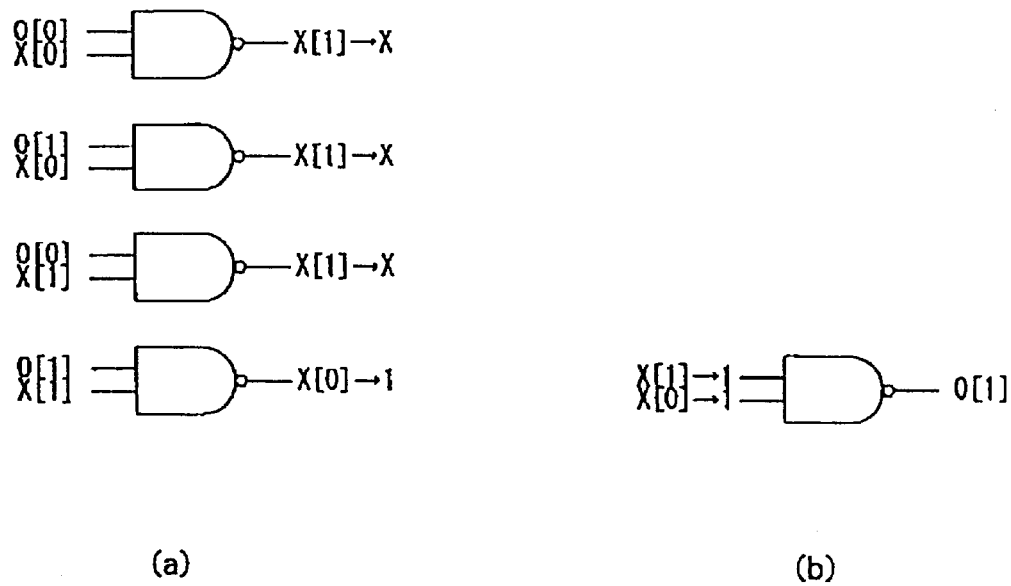
FIG. 13 is a diagram showing examples of results of implication operations in the fault propagation path estimating apparatus shown in FIG. 9 in the form of a circuit diagram showing estimation results of logical states of inputs and an output in a two-input NAND gate.

As an example of the implication operation in the fault propagation path estimating apparatus of the embodiment, FIG. 13 shows results of implication operations for a two-input NAND gate. FIG. 13($a$) shows results of logical state estimation of an output signal line when the logical state of one of input signal lines of the two-input NAND gate is "0," while FIG. 13($b$) shows results of logical state estimation of the input signal lines when the logical state of the output signal line of the two-input NAND gate is "1." Numbers in brackets [ ] are expected values.

Figure 5:
FIG. 5 is a diagram showing examples of results of implication operations in the conventional fault propagation path estimating apparatus in the form of a circuit diagram showing estimation results of logical states of inputs and an output in a two-input NAND gate.
Figure 5:
Figure 5:
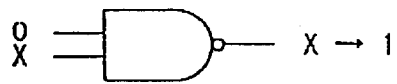
Figure 5:
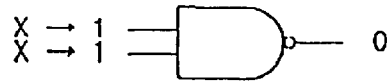
Figure 5:
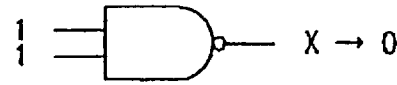
Figure 5:
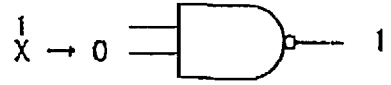

In the conventional fault propagation path estimating apparatus, as shown in FIG. 5($a$), when the logical state of one of the input signal lines of the NAND gate is "0," the output signal line is estimated as "1" with the implication operation. However, in the embodiment, as shown in FIGS. 13($a$) and ($b$), the implication operation estimates only the logical state of the output signal line with a value different from the expected value. Thus, even in the combinational logic circuit having a loop shown in FIG. 7, output signal line L3 of gate G1 is not estimated as a normal state at the implication operation of gate G1, thereby making it possible to trace the fault propagation path from the output side of the combinational logic circuit.

Next, when no implication operation-capable gate is detected at step B3 shown in FIG. 12, data processing unit 12 terminates the implication operation to move to processing at step A5 shown in FIG. 11.

At step A5, logical contradiction determining section 24 is used to determine whether the number of the occurrences of logical contradictions exceeds the allowable number. If the number of the occurrences of logical contradictions does not exceed the allowable number, processing end determining section 25 is used to refer to the logical states of the respective signal lines stored in logical state storing section 44 for determining whether the logical states of all the signal lines have been estimated as "0," "1" or "X" (step A6).

If processing end determining section 25 determines that the logical states of all the signal lines have not been estimated at step A6, data processing unit 2 checks the logical states of the inputs and outputs of the respective gates to detect any signal line in a logical state Unknown, using U (Unknown) state search section 27 (step A7). Then, fault propagation path affecting line search section 28 is used to detect a signal line relating to the fault propagation path of the signal lines in the Unknown state detected at step A7 (step A8).

Subsequently, logical value decision section 29 is used to decide the logical state of the signal line detected by fault propagation path affecting line search section 28 as "0," and the decision level indicating the number of decisions is incremented by one (dlevel+1) (step A9). The processing then returns to the implication operation processing (step A4) with implication operation section 23.

On the other hand, if the logical states of all the signal lines are determined as estimated at step A6, the logical states of all the signal lines in the combinational logic circuit have been defined as "0," "1" or "X." Thus, logical value comparing section 30 is used to extract a signal line in a logical state different from its expected value, i.e. a fault propagation path (step A10).

Additionally, fault output terminal connected and related line extracting section 31 is used to extract a fault propagation path affecting an output terminal (fault terminal) of the combinational logic circuit, and the fault propagation path is outputted using output device (step A11).

Next, data processing unit 2 determines whether or not the decided lines have been subjected to decision processing for both "0" and "1" (step A12) using processing end determining section 25, and if all the decision processing is completed, completes the fault propagation path extracting processing.

If all the decision processing is not completed, back track section 26 is used to extract one of the decided lines which have not been decided as "1" that has a greater decision level, and the logical state of the signal line estimated with decision processing corresponding to a greater decision level than that of the extracted decided line is initialized to "U" to return the logical states of the respective signal lines to the logical states before the decision (step A13).

Subsequently, the logical state of the decided line extracted at step A13 is decided as "1" (step A14), and the processing returns to step A4 to again perform the implication operation with implication operation section 23.

As described above, in the embodiment, since the implication operation is performed without propagating a normal logical state to the output side, a fault point is not erroneously estimated as a normal signal line to result in improvement in accuracy of estimation of the fault propagation path.

Also, since the gate with the logical contradiction generated during the implication operation and the number of the occurrences of logical contradictions are recorded in logical contradiction storing section 42 and the implication operation is continued even when the logical contradiction occurs, it is possible to reproduce the logical state at an arbitrary time in the processing.

Additionally, the history information of the implication operations recorded in logical state storing section 44 and the logical contradiction information recorded in logical contradiction storing section 42 are used to trace the history of the implication operations if the number of the occurrences of logical contradictions exceeds the preset allowable number until it does not exceeds the allowable number. Therefore, it is possible to estimate "a fault propagation path in which a fault occurs inside the combinational logic circuit and a faulty state propagates from the input side, both of which affect each other," thereby improving accuracy of estimation of the fault propagation path.

Figure 6:
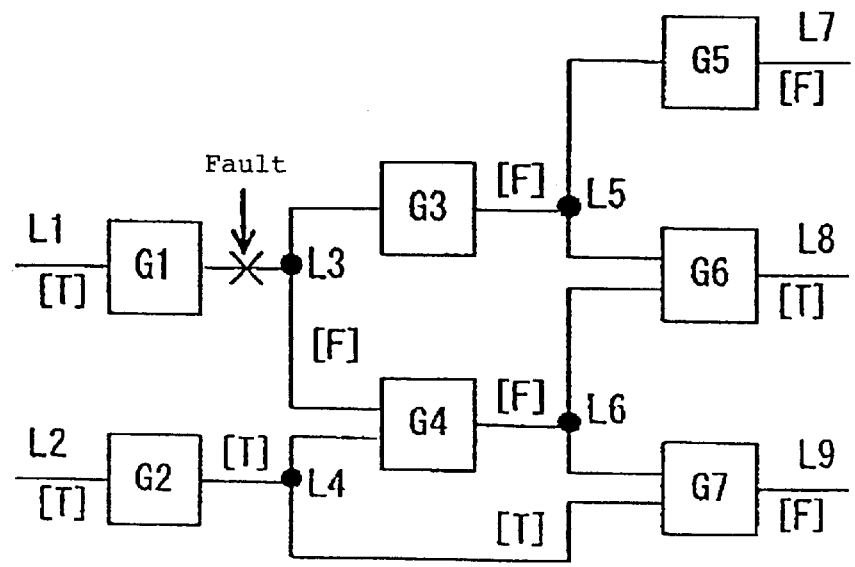
FIG. 6 is a circuit diagram showing an example of a combinational logic circuit for which a fault propagation path is estimated.
Figure 7:
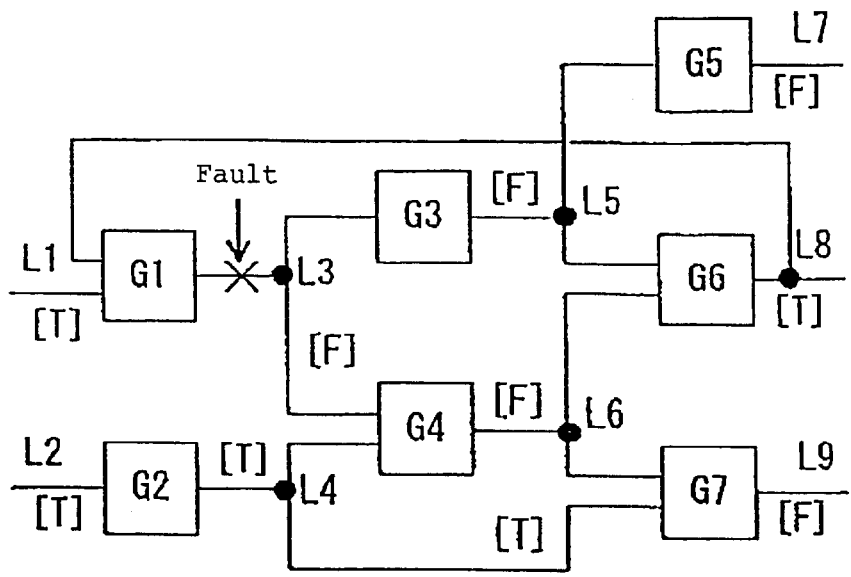
FIG. 7 is a circuit diagram showing another example of a combinational logic circuit for which a fault propagation path is estimated.

Next, description is made for a specific estimation procedure for a fault propagation path in the fault propagation path estimating apparatus of the embodiment using the logical circuits shown in FIG. 6 and FIG. 7 as examples similarly to the conventional fault propagation path estimating apparatus.

First, description is made for a case where the fault propagation path in the combinational logic circuit shown in FIG. 6 is extracted with the conventional fault propagation path estimating apparatus shown in FIG. 9. It is assumed that the combinational logic circuit shown in FIG. 6 has a fault occurring at the output signal line of gate G1 similarly to the example in the prior art, and that the logical states of input terminals L1 and L2 and output terminals L7, L8 and L9 are given at the initial setting. Each symbol in brackets [ ] for each signal line represents a result of a comparison with the expected value, either in a normal state (True) or a fault state (False). In the case of the combinational logic circuit shown in FIG. 6, the fault occurring at the output of gate G1 propagates through signal lines L3, L5 and L6 to signal lines L7 and L9 connected to output terminals. It is assumed herein that only the logical states of the input terminals and output terminals can be observed, and logical states of the signal lines other than those are not known.

In FIG. 6, when the logical states of the input/output terminals are specified as L1=[T], L2=[T], L7=[F], L8=[T], and L9=[F] through input device 1, data processing unit 2 sets the logical states of the input/output terminals respectively in specified states using initial setting section 21, and sets the logical states of the signal lines other than the input/output terminals to "X" using X (Don't Care) state setting section 22 (steps A1 to A3).

Next, data processing unit 2 detects a gate on the input side connected to a normal signal line from within the combinational logic circuit using implication-capable normal signal line search subsection 236 in implication operation section 23. In this case, gates G6 connected to signal line L8 is detected (step B2), and implication operation processing is continued in response to the determination that the implication operation is not completed (step B3).

Next, data processing unit 2 performs a basic implication operation using basic implication operation subsection 231 in implication operation section 23 (step B4). Specifically, data processing unit 2 estimates the logical states of the input/output lines as "0" or "1" based on a true table of each gate, and compares the result with the expected value to determine [T] or [F]

In this case, gate G6 is "a gate which has one or both of the input signal lines in a fault state when its output is in a fault state." At this point, the logical states of input signal lines L5 and L6 of gate G6 cannot be estimated. Therefore, logical contradiction registering subsection 232 detects no contradiction (step B5), and no signal line to be initialized by normal output line logical state initializing subsection 234 is detected (step B7).

Subsequently, data processing unit 2 searches a gate connected to a fault propagation signal line using implication-capable fault signal line search subsection 235 in implication operation section 23 to detect gate G5 connected to signal line L7 and gate G7 connected to signal line L9 (step B1).

Since the implication-capable gates are detected at step B1, data processing unit 2 estimates L5=[F] with the implication operation for gate G5, and L4=[T] and L6=[F] with the implication operation for gate G7 (step B4) using basic implication operation subsection 231 in implication operation section 23, and determines a logical contradiction using logical contradiction registering subsection 232 (step B5).

Next, data processing unit 2 detects a normal signal line on the output side for which the implication operation has been performed and initializes it to the logical state before the implication operation using normal output line logical state initializing subsection 234 in implication operation section 23 (step B7). However, no signal line is detected in this case.

Data processing unit 12 then returns to step B2 to detect gate G2 connected to L4=[T] using implication-capable normal signal line search subsection 234 in implication operation section 23. At this point, gate G4 is not detected since it is connected to the output side of signal line L4.

Subsequently, basic implication operation subsection 231 is used to perform the basic implication operation (step B4), but no signal line is newly estimated. Therefore, no logical contradiction is detected (step B5) and no signal line is initialized by normal output line logical state initializing subsection 234 (step B7).

Next, data processing unit 2 returns to step B1 and searches a gate connected to a fault propagation signal line using implication-capable fault signal line search subsection 235 in implication operation section 23 to detect gate G3 connected to signal line L5 and gate G4 connected to signal line L6.

Basic implication operation subsection 231 is then used to estimate L3=[F] with implication operations for gates G3 and G4 (step B4), and logical contradiction registering subsection 232 is used to determine a logical contradiction (step B5). However, no logical contradiction is detected in this case and no signal line is initialized by normal signal line logical state initializing subsection 234 (step B7).

Next, data processing unit 2 returns to step B1 and searches a gate connected to a fault propagation signal line using implication-capable fault signal line search subsection 235 in implication operation section 23 to detect gate G1 connected to signal line L3.

Basic implication operation subsection 231 is used to estimate L1=[F] with the implication operation for gate G1 (step B4). Since signal L1 has been set as [T] at the initial setting, a logical contradiction is detected at step B5. Assuming that the allowable number of the logical contradiction is one, the allowable number is not exceeded since this contradiction is the first. Thus, the processing is continued. However, since the estimation for all the signal lines is completed at this point, it is determined that no implication-capable gate is present at B3 and the implication operation is terminated.

With the aforementioned processing, the logical states of all the signal lines are respectively estimated to obtain signal lines L3, L5, L6, L7, and L9 as a fault propagation path.

Next, description is made for a case where a fault propagation path is extracted in the combinational logic circuit having a loop as shown in FIG. 7 with the fault propagation path estimating apparatus of the embodiment.

When the fault propagation path in the combinational logic circuit shown in FIG. 7 is extracted, the procedure until the initial setting of the logical states of the input/output terminals as L1=[T], L2=[T], L7=[F], L8=[T], and L9=[F] are similar to the processing for the combinational logic circuit shown in FIG. 6 (steps A1 to A3).

Next, data processing unit 2 searches a gate on the input side connected to a normal signal line using implication-capable normal signal line search subsection 236 in implication operation section 23 to detect gate G6 connected to signal line L8 (step B2). Gate G1 is not detected since it is connected to the output side of signal line L8. Thereafter, the logical states of the respective signal lines are estimated similarly to the procedure for the combinational logic circuit shown in FIG. 6, and signal lines L3, L5, L6, L7, and L9 are obtained.

Therefore, since a normal signal does not propagate to the output side, a fault point is not estimated as a normal signal line, thereby allowing correct estimation of the fault propagation path even with the loop present within the circuit.

Figure 8:
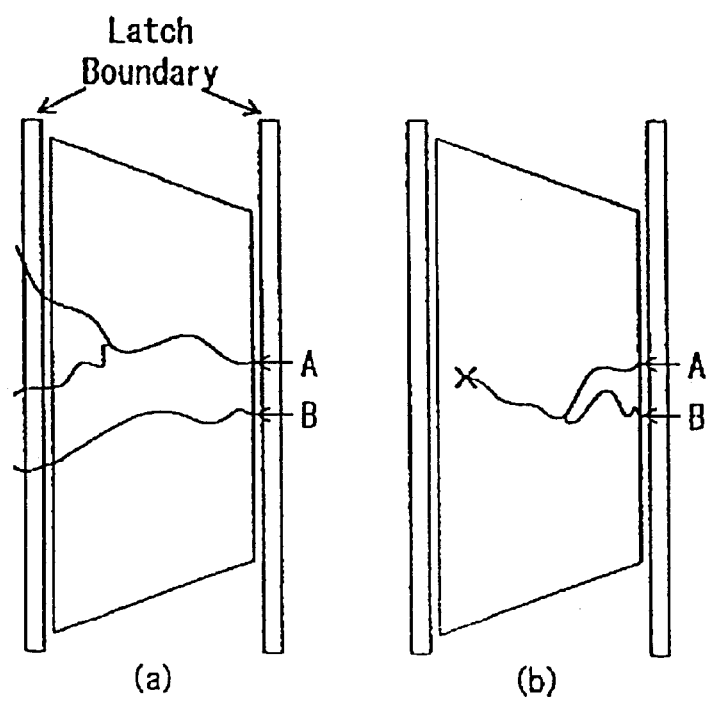
FIGS. 8(a) to 8(d) are schematic diagrams showing examples of propagation paths of faults generated in a combinational logic circuit.
Figure 8:
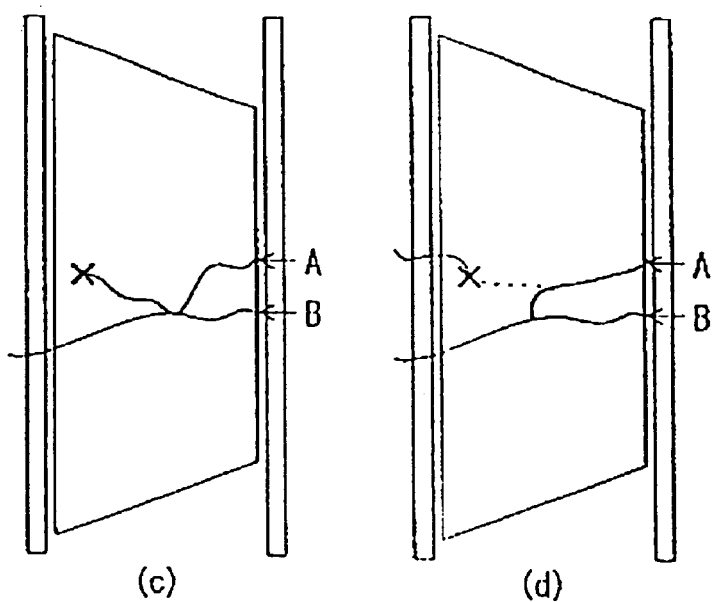

For obtaining "a fault propagation path in which a fault exists within a combinational logic circuit and a faulty state propagates from an input terminal" as shown in FIGS. 8(c) and 8(d), the implication operation needs to be continued even when a logical contradiction occurs.

The fault propagation path estimating apparatus of the embodiment continues the implication operation when the number of occurrences of logical contradictions falls within the preset allowable number by using the implication history recorded in logical state storing section 44 and the information on the signal lines with the logical contradiction generated and on the number of occurrences recorded in logical contradiction storing section 42. When the number of occurrences of logical contradictions exceeds the allowable number, the implication history is traced until the number becomes below the allowable number to hold it within the allowable range as described below.

Figure 14:
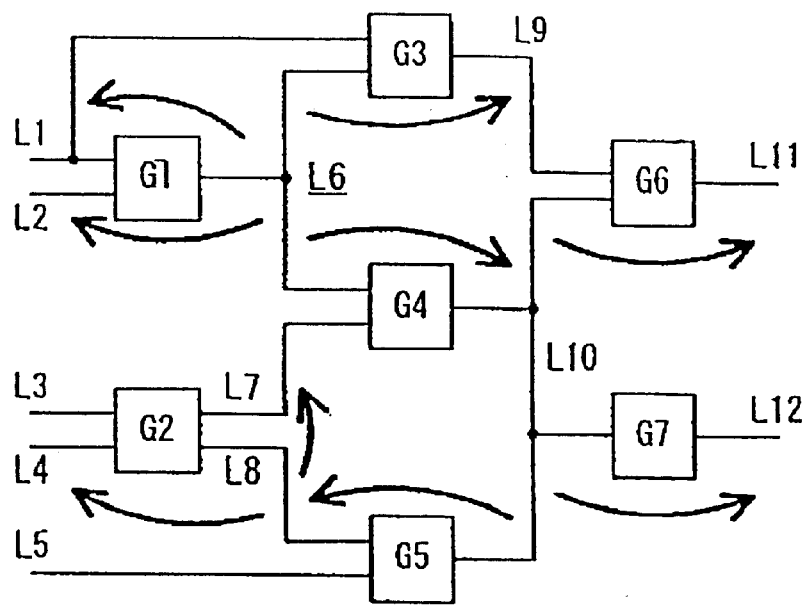
FIG. 14 is a circuit diagram showing an example of a combinational logic circuit for which the fault propagation path estimating apparatus shown in FIG. 9 records an implication history.

For example, consideration is made for a case where logical contradictions occur in the implication operations for gate G7 and gate G2 when the allowable number of the logical contradiction is one for the combinational logic circuit shown in FIG. 14.

First, when the logical contradiction occurs in the implication operation for gate G7, gate G7 is registered as a logical contradiction occurring point in logical contradiction storing section 42 since the number of occurrences of logical contradictions is one at this point. Subsequently, when the logical contradiction occurs in the implication operation for gate G2, gate G2 is registered as a logical contradiction occurring point in logical contradiction storing section 42. However, since the number of occurrences of logical contradictions is two, the logical state of signal line L8 is determined as erroneous to initialize a tree structure having signal line L8 at its top, and gate G5 is registered as a logical contradiction occurring point instead of gate G2.

Nevertheless, the logical contradictions occur at two points of gates G5 and G7 and the allowable number is exceeded. Thus, the logical state of signal line L10 is determined as erroneous to initialize Sub-Tree data of signal line L10, and gate G4 is registered as a contradiction point instead of gates G5 and G7. With the aforementioned processing, the contradiction point becomes one and the logical contradiction falls within the allowable range.

Logical state storing section 44 manages the history (implication history) of the logical states of the respective signal lines estimated with the implication operations as described above in the form of the tree structure or the stack structure. When the logical state of an arbitrary signal line is intended to be returned to the state before the implication operation, erasing part of data in the tree structure or stack structure easily enables the return thereof to the previous logical state. The method of recording the implication history is described using FIG. 14 to FIG. 17.

Figure 15:
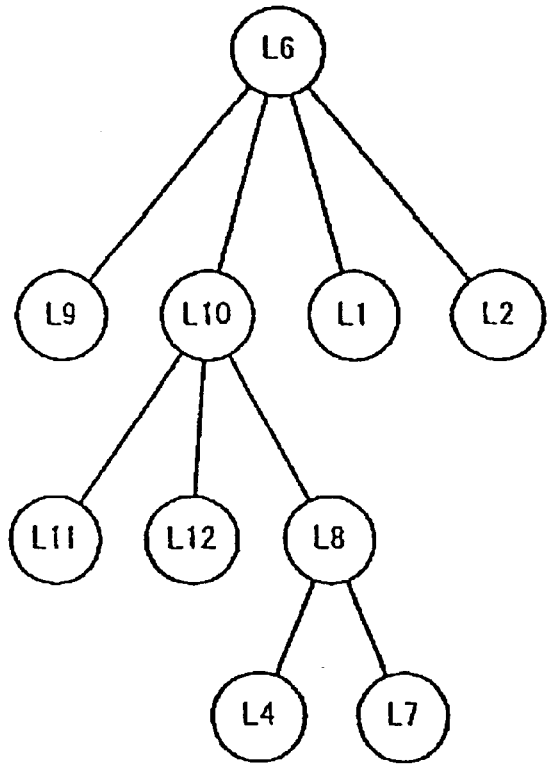
FIG. 15 is a schematic diagram showing the implication history using signal line L6 of the combinational logic circuit shown in FIG. 14 as a base point in the form of a tree structure.
Figure 16:
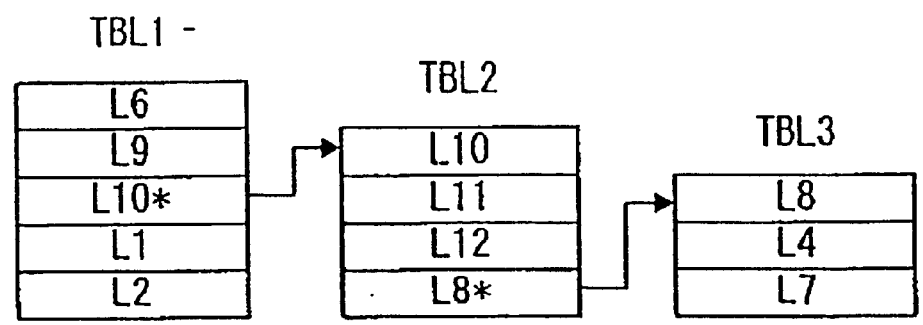
FIG. 16 is a table diagram showing a storage form of data for realizing the implication history in the tree structure shown in FIG. 15.
Figures 17, 18:
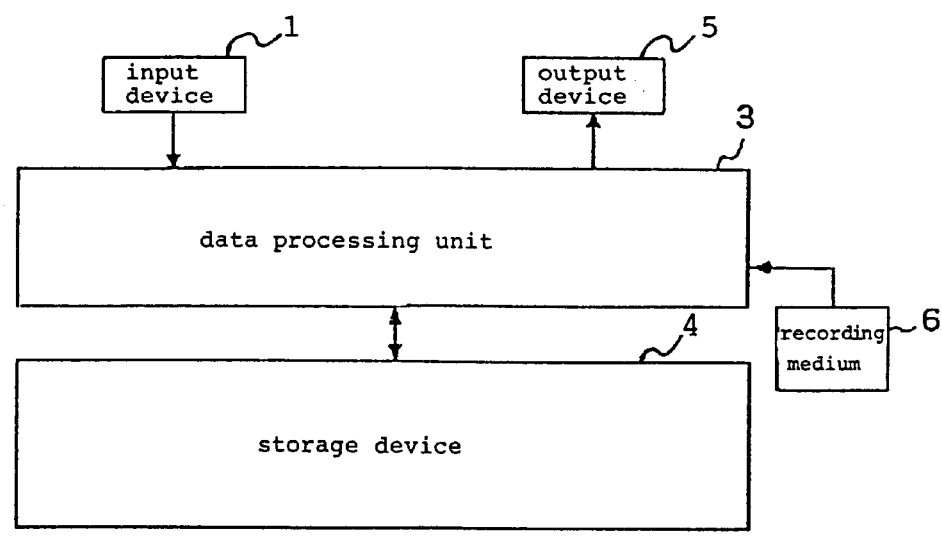
FIG. 17 is a table showing a storage form of data for recording the implication history using signal line L6 of the combinational logic circuit shown in FIG. 14 as a base point in a stack structure.
FIG. 18 is a block diagram showing a configuration of a second embodiment of the fault propagation path estimating apparatus of the present invention.

FIG. 14 is a circuit diagram showing an example of the combinational logic circuit for which the implication history is recorded with the fault propagation path estimating apparatus shown in FIG. 9, and FIG. 15 is a schematic diagram showing in the tree structure the implication history using signal line L6 of the combinational logic circuit shown in FIG. 14 as a base point. FIG. 16 is a table diagram showing a storage form of data for realizing the implication history in the tree structure shown in FIG. 15, and FIG. 17 is a table showing in the stack structure a storage form of data for recording the implication history using signal line L6 of the combinational logic circuit shown in FIG. 14 as a base point.

For example, when the implication operation is performed using signal line L6 of the combinational logic circuit shown in FIG. 14 as the base point, the implication operation is performed in the order of gates G3, G4 on the output side of signal line L6 to gate G1 on the input side of signal line L6 to estimate the logical states of signal lines L9, L10, L1, and L2, respectively. The roots of arrows in FIG. 14 represent signal lines from which the implication is performed, while the points of the arrows represents signal lines to which the implication is performed.

FIG. 15 shows, in the tree structure, the history of the implication operations using signal line L6 of the combinational logic circuit shown in FIG. 14 as the base point. For example, the logical state of signal line L10 before the implication operation is obtained by deleting part of the tree structure, i.e. the data having signal line L10 as its top in the tree structure.

The storage method of data in the tree structure form realizes the tree structure, for example, by creating tables (TBL1, TBL2, TBL3) for respective Sub-Tables as shown in FIG. 16 in which the top address of a table below a signal line having a Sub-Table is recorded in the data of the signal line. In this case, the top address of table TBL2 below signal line L10 is stored in the data of signal line L10 in table TBL1, and the top address of table TBL3 below signal line L8 is stored in the data of signal line L8 in table TBL2.

The implication history may also be stored in the stack structure as shown in FIG. 17. In FIG. 17, the numbers of signal lines and implication levels are recorded (stacked) in a table form in the order of the estimation of the logical states with the implication operations. The implication level refers to the number representing how many implication operations have been performed to estimate the logical state starting with the signal line used as the base point of the implication operation. For example, it is assumed that the implication level of signal line L6 which serves as the starting point of the implication operation is zero, and that the implication level of a signal line which is subjected to the implication operation with signal line L6 is one.

For returning the logical state of signal line L10 to the state immediately before the implication operation using the implication history in the stack structure as shown in FIG. 17, the data obtained from the implication operation after signal line L10 may be deleted. Specifically, the data with a greater implication level than that of signal line L10 (L11, L12, L8, L4, and L7) is deleted. The resultant processing is similar to that performed when the Sub-Tree data having signal line L10 as its top is deleted in the tree structure.

Second Embodiment

Next, a second embodiment of the present invention is described with reference to FIG. 18.

FIG. 18 is a block diagram showing a configuration of the second embodiment of the fault propagation path estimating apparatus of the present invention.

In FIG. 18, data processing unit 3 of the embodiment comprises a CPU and a computer including a storage element for temporarily storing information required for processing. The fault propagation path estimating apparatus of the embodiment further comprises recording medium 6 which records a fault propagation path estimating program for estimating a fault propagation path in a combinational logic circuit. Recording medium 6 may be a magnetic disk, optical disk, semiconductor memory or other recording media.

Data processing unit 3 reads the fault propagation path estimating program from recording medium 6 and performs processing similar to the processing performed by the respective blocks of the first embodiment in accordance with the fault propagation path estimating program. Since the other configurations are similar to those of the first embodiment, the description thereof is omitted.

The present invention is configured as described above, and produces the following effects.

A gate connected to the input side of a normal signal line in a logical state estimated as equal to its expected value with an implication operation is detected as a newly implication-capable gate, a gate connected to the output side of the normal signal line is not set as the implication-capable gate, and a signal line connected to the output side of a gate in a logical state estimated as equal to its expected value with an implication operation for the implication-capable gate is initialized to the logical state before the implication operation, thereby preventing a normal logical state from propagating to the output side during estimation. Therefore, since the implication operation can be performed without propagating the normal logical state to the output side, a fault point is not erroneously estimated as a normal signal line to improve accuracy of estimation of the fault propagation path.

When a logical contradiction occurs between the newly estimated logical state with the implication operation and the previously estimated logical state, the signal line with the generated logical contradiction is registered and the number of occurrences of logical contradictions is recorded. The implication operation can be continued even with the logical contradiction generated, and it is possible to reproduce the logical state at an arbitrary point in processing.

Additionally, the result of the implication operation is stored as the history information. When the number of occurrences of logical contradictions exceeds the preset allowable number, the history information is traced to initialize the logical state of the signal line which causes the logical contradiction exceeding the allowable number to the state before the implication operation until the number of occurrences of logical contradictions falls within the allowable number, thereby making it possible to reproduce a fault propagation path in which the number of occurrences of logical contradictions falls within the allowable number. Therefore, it is possible to estimate "a fault propagation path in which a fault occurs inside the combinational logic circuit and a faulty state propagates from an input side, both of which affect each other," to improve accuracy of estimation of the fault propagation path.

What is claimed is:

1. A method of estimating a fault propagation path for extracting a fault propagation path in a combinational logic circuit by repeating decisions and implication operations for a logical state to estimate a logical state inside said combinational logic circuit and comparing the estimated logical state with an expected value which indicates a logical state in a normal operation of said combinational logic circuit, said method comprising the steps of:

detecting with said implication operation, as a newly implication-capable gate, a gate connected to an input side of a normal signal line estimated as in a logical state equal to said expected value and a gate connected to input and output sides of a signal line in a fault state estimated as in a logical state different from said expected value; and initializing a signal line on an output side of a gate estimated as in a logical state equal to said expected value with an implication operation for said implication-capable gate to a logical state before said implication operation.

2. A method of estimating a fault propagation path for extracting a fault propagation path in a combinational logic circuit by repeating decisions and implication operations for a logical state to estimate a logical state inside said combinational logic circuit and comparing the estimated logical state with an expected value which indicates a logical state in a normal operation of said combinational logic circuit, said method comprising the step of:

when a logical contradiction occurs between a logical state newly estimated with said implication operation and a logical state previously estimated, registering a signal line in which said logical contradiction occurs and recording a number of occurrences of said logical contradiction.

3. The method of estimating a fault propagation path according to claim 2, wherein a result of said implication operation is stored as history information, and when the number of occurrences of said logical contradiction exceeds a preset allowable number, said history information is traced to initialize a logical state of a signal line causing a logical contradiction exceeding said allowable number to a state before an implication operation until the number of occurrences falls within said allowable number.

4. The method of estimating a fault propagation path according to claim 3, wherein said history information is stored in a tree structure.

5. The method of estimating a fault propagation path according to claim 3, wherein said history information is stored in a stack structure.

6. A fault propagation path estimating apparatus for extracting a fault propagation path in a combinational logic circuit by repeating decisions and implication operations for a logical state to estimate a logical state inside said combinational logic circuit and comparing the estimated logical state with an expected value which indicates a logical state in a normal operation of said combinational logic circuit, said apparatus comprising:

an implication-capable normal signal line search subsection for detecting, as a newly implication-capable gate, a gate connected to an input side of a normal signal line estimated as in a logical state equal to said expected value with said implication operation;

an implication-capable fault signal line search subsection for detecting, as a newly implication-capable gate, a gate connected to input and output sides of a signal line in a fault state estimated as in a logical state different from said expected value with said implication operation; and a normal output line logical state initializing subsection for initializing a signal line on an output side of a gate estimated as in a logical state equal to said expected value with an implication operation for said implication-capable gate to a logical state before said implication operation.

7. A fault propagation path estimating apparatus for extracting a fault propagation path in a combinational logic circuit by repeating decisions and implication operations for a logical state to estimate a logical state inside said combinational logic circuit and comparing the estimated logical state with an expected value which indicates a logical state in a normal operation of said combinational logic circuit, said apparatus comprising:

a logical contradiction storing section for recording a signal line in which a logical contradiction occurs between a logical state newly estimated with said implication operation and a logical state previously estimated, and a number of occurrences of said logical contradiction; and a logical contradiction registering subsection for registering, when a logical contradiction occurs between a logical state newly estimated with said implication operation and a logical state previously estimated, a signal line in which said logical contradiction occurs and recording the number of occurrences of said logical contradiction in said logical contradiction storing section.

8. The fault propagation path estimating apparatus according to claim 7, further comprising:

a logical state storing section for storing a result of said implication operation as history information, and a contradiction signal line initializing subsection for tracing said history information when the number of occurrences of said logical contradiction exceeds a preset allowable number to initialize a logical state of a signal line causing a logical contradiction exceeding said allowable number to a state before an implication operation until the number of occurrences falls within said allowable number.

9. The fault propagation path estimating apparatus according to claim 8, wherein said logical state storing section stores said history information in a tree structure.

10. The fault propagation path estimating apparatus according to claim 8, wherein said logical state storing section stores said history information in a stack structure.

11. A recording medium for recording a program which causes a computer to execute fault propagation path estimating processing for extracting a fault propagation path in a combinational logic circuit by repeating decisions and implication operations for a logical state to estimate a logical state inside said combinational logic circuit and comparing the estimated logical state with an expected value which indicates a logical state in a normal operation of said combinational logic circuit, said program causing the computer to execute:

implication-capable normal signal line search processing for detecting, as a newly implication-capable gate, a gate-connected to an input side of a normal signal line estimated as in a logical state equal to said expected value with said implication operation;

implication-capable fault signal line search processing for detecting, as a newly implication-capable gate, a gate connected to input and output sides of a signal line in a fault state estimated as in a logical state different from said expected value with said implication operation; and normal output line logical state initializing processing for initializing a signal line on an output side of a gate estimated as in a logical state equal to said expected value with an implication operation for said implication-capable gate to a logical state before said implication operation.

12. A recording medium for recording a program which causes a computer to execute fault propagation path estimating processing for extracting a fault propagation path in a combinational logic circuit by repeating decisions and implication operations for a logical state to estimate a logical state inside said combinational logic circuit and comparing the estimated logical state with an expected value which indicates a logical state in a normal operation of said combinational logic circuit, said program causing the computer to execute:

logical contradiction registering processing for registering, when a logical contradiction occurs between a logical state newly estimated with said implication operation and a logical state previously estimated, a signal line in which said logical contradiction occurs and recording a number of occurrences of said logical contradiction.

13. The recording medium according to claim 12, wherein a program is recorded which causes the computer to execute:

logical state storing processing for storing a result of said implication operation as history information, and contradiction signal line initializing processing for tracing said history information when the number of occurrences of said logical contradiction exceeds a preset allowable number to initialize a logical state of a signal line causing a logical contradiction exceeding said allowable number to a state before an implication operation until the number of occurrences falls within said allowable number.

14. The recording medium according to claim 13, wherein a program is recorded for storing said history information in a tree structure.

15. The recording medium according to claim 13, wherein a program is recorded for storing said history information in a stack structure.

* * * * *